United States Patent
Maruyama et al.

(10) Patent No.: US 6,466,046 B1
(45) Date of Patent: Oct. 15, 2002

(54) CONTACTOR FOR SEMICONDUCTOR DEVICES, A TESTING APPARATUS USING SUCH CONTACTOR, A TESTING METHOD USING SUCH CONTACTOR, AND A METHOD OF CLEANING SUCH CONTACTOR

(75) Inventors: Shigeyuki Maruyama; Futoshi Fukaya; Makoto Haseyama, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/362,111

(22) Filed: Jul. 28, 1999

(30) Foreign Application Priority Data

Dec. 18, 1998 (JP) .............................................. 10-361618

(51) Int. Cl.[7] .......................... G01R 31/02; G01R 31/26
(52) U.S. Cl. ........................ 324/760; 324/755; 324/765
(58) Field of Search ................................ 324/755, 754, 324/760, 765

(56) References Cited

U.S. PATENT DOCUMENTS

| | | | |
|---|---|---|---|
| 4,906,920 A | * 3/1990 | Huff et al. | 324/755 |
| 5,567,165 A | 10/1996 | Matsuoka | |
| 5,757,199 A | * 5/1998 | Maruyama | 324/754 |
| 5,949,241 A | * 9/1999 | Akram et al. | 324/755 |
| 5,982,185 A | * 11/1999 | Farnworth | 324/755 |
| 5,990,566 A | * 11/1999 | Farnworth et al. | 257/783 |
| 6,046,598 A | * 4/2000 | Miyaji et al. | 324/755 |
| 6,078,186 A | * 6/2000 | Hembree et al. | 324/755 |
| 6,229,320 B1 | * 5/2001 | Haseyama et al. | 324/754 |

FOREIGN PATENT DOCUMENTS

| | | |
|---|---|---|
| EP | 0 250 934 | 1/1988 |
| EP | 0 701 136 A2 | 3/1996 |
| JP | 2-297941 | 12/1990 |
| JP | 4-112550 | 4/1992 |
| JP | 7-94561 | 4/1995 |
| JP | 7-115113 | 5/1995 |
| JP | 7-161788 | 6/1995 |
| JP | 7-231019 | 8/1995 |
| JP | 8-5666 | 1/1996 |
| JP | 8-340030 | 12/1996 |
| JP | 9-115971 | 5/1997 |
| JP | 10-256323 | 9/1998 |

* cited by examiner

*Primary Examiner*—Michael Sherry
*Assistant Examiner*—Jermele Hollington
(74) *Attorney, Agent, or Firm*—Armstrong, Westerman & Hattori, LLP

(57) ABSTRACT

A contactor for semiconductor devices includes a base unit for holding a semiconductor device provided with a plurality of terminals and a wiring substrate provided with contact electrodes at positions corresponding to at least some of the terminals. The contact electrodes and the terminals are electrically connected when the wiring substrate is held on the base unit. The contactor further includes a position maintaining force applying mechanism for applying a position maintaining force between the base unit and the wiring substrate and a contact pressure applying mechanism for applying a contact pressure between the semiconductor device and the wiring substrate. The position maintaining force applying mechanism and the contact pressure applying mechanism are operable in an independent manner.

20 Claims, 19 Drawing Sheets

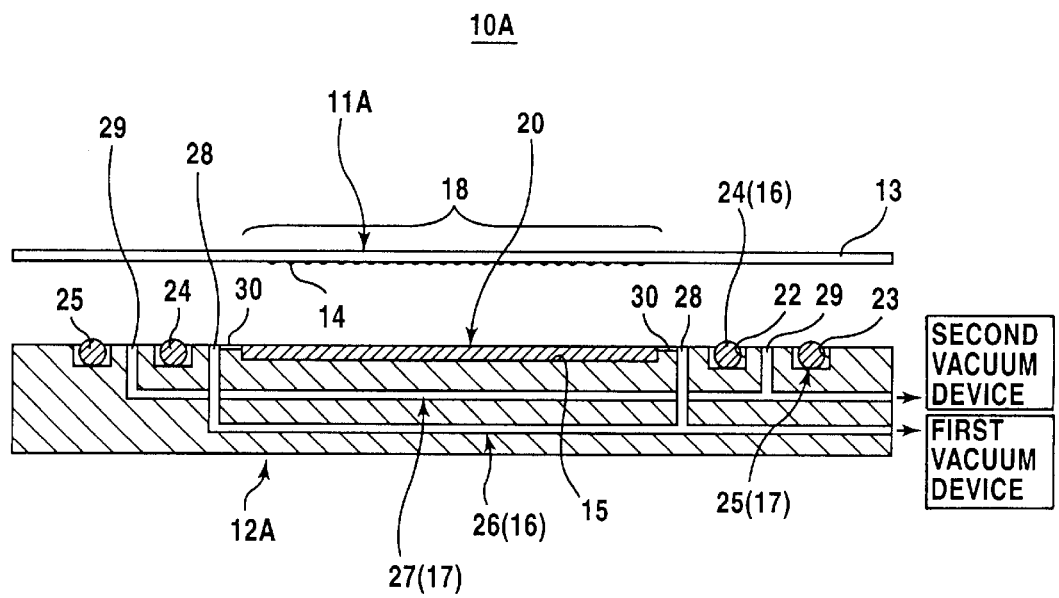
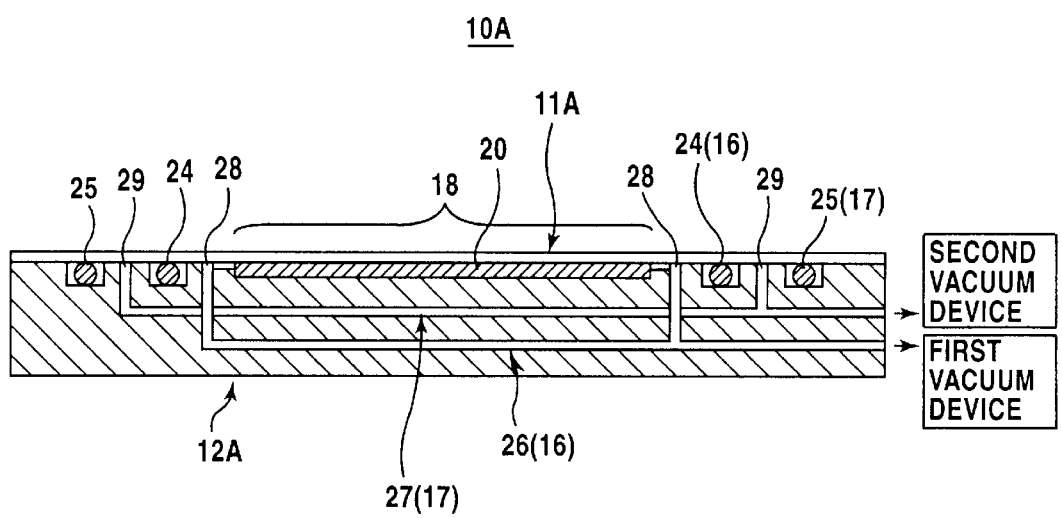

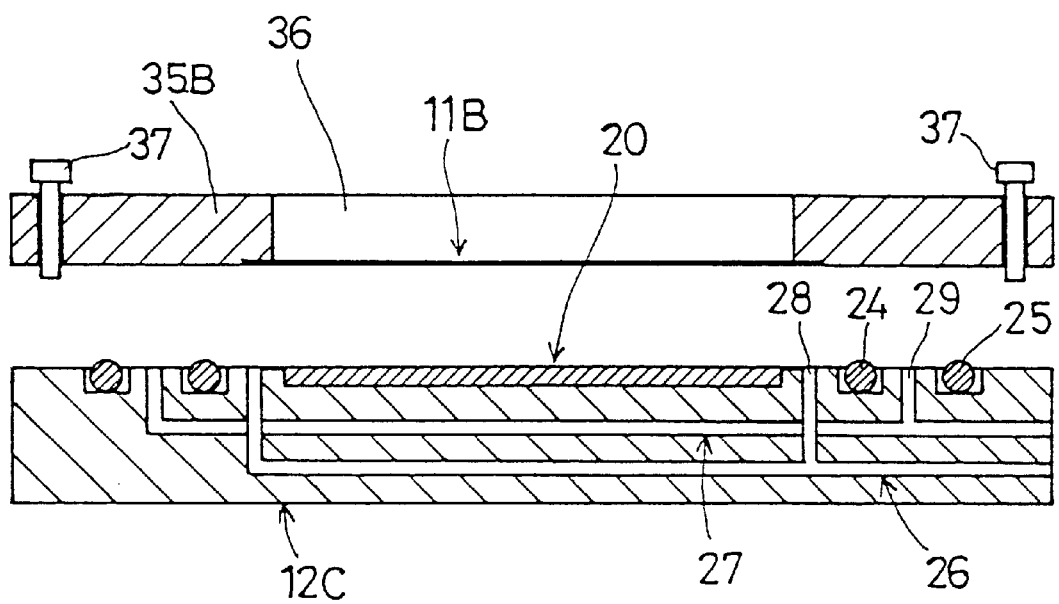

CONTACTOR FOR SEMICONDUCTOR DEVICES, A TESTING APPARATUS USING SUCH CONTACTOR, A TESTING METHOD USING SUCH CONTACTOR, AND A METHOD OF CLEANING SUCH CONTACTOR

BACKGROUND OF THE INVENTION

1. Field of the Invention

The present invention generally relates to a contactor for semiconductor devices, a testing apparatus using such a contactor, a testing method using such a contactor and a method of cleaning such a contactor, and particularly relates to a contactor for obtaining an electrical contact with a semiconductor device such as a wafer, a bare chip, a BGA (Ball Grid Array), an SOP (Small Outline Package) and a QFP (Quad Flat Package), a testing apparatus and a testing method using the contactor, and a method of cleaning such a contactor.

Recently, there is an increasing need for further miniaturized, high-speed and high-density semiconductor devices. Therefore, in order to provide terminals corresponding with such semiconductor devices, efforts are being made to achieve a further fine-pitched structure of the terminals provided on the semiconductor devices. Also, in order to improve the testing efficiency of the semiconductor devices, there is a need for simultaneously contacting a plurality of semiconductor devices, for example, at a wafer level.

However, the height of the terminals of the semiconductor devices and the height of contact electrodes are varied. Therefore, it is technically very difficult to connect the contact electrodes to all of the fine-pitched terminals.

2. Description of the Related Art

FIG. 1 is a cross-sectional diagram showing a contactor 1 for a semiconductor device (hereinafter referred to as a contactor) of the related art. As shown in the Figure, the contactor 1 includes a wiring substrate 2, an anisotropic conductive sheet 4, a multilayer substrate 5, and a base member 6.

The wiring substrate 2 includes a base film made of resin and a wiring pattern formed thereon. Also, a part of the wiring pattern is provided with contact electrodes 3 to which terminals of a semiconductor device 8 (in the Figure, a wafer is illustrated as an example of the semiconductor device) are connected. The contact electrodes 3 extend to an upper surface (i.e., a surface opposite a surface provided with the contact electrodes 3) of the wiring substrate 2 via through holes or vias (not shown) formed in the base film.

The multilayer substrate 5 is a multilayer wiring printed-circuit board, which includes a substrate made of glass-epoxy whereon a plurality of wiring substrate layers provided with wiring patterns are laminated. Also, the layers provided with the wiring patterns are each electrically connected by elements such as through holes. Therefore, in the related art, the multilayer substrate 5 is made of an extremely hard material (or a material with a high rigidity).

In the contactor 1 shown in the Figure, the anisotropic conductive sheet 4 is provided between the wiring substrate 2 and the multilayer substrate 5. The anisotropic conductive sheet 4 is elastic and is conductive in a vertical direction in the Figure, so that an electric connection is established only at only at locations under pressure.

If the wiring substrate 2 is provided directly on the multilayer substrate 5 with high rigidity, it is not possible to overcome the variation of the heights of the terminals of the semiconductor device 8 or the contact electrodes 3 of the wiring substrate 2. The purpose of using the anisotropic conductive sheet 4 is to avoid such a drawback and thus positively connect the contact electrodes 3 to the plurality of terminals. Also, the wiring substrate 2, the anisotropic conductive sheet 4 and the multilayer substrate 5 constitute an integrated body.

The base member 6 is provided with a mounting portion 7 having a recessed shape corresponding to the contour of the semiconductor device 8. The semiconductor device 8 is mounted in the mounting portion 7 so as to be maintained by the base member 6.

For electrically connecting the contactor 1 of the above structure and the semiconductor device 8, the semiconductor device 8 is mounted on the mounting portion 7 of the base member 6. Then, the wiring substrate 2 is pressed onto the semiconductor device 8. Thus, the contact electrodes 3 and the terminals of the semiconductor device 8 are connected and it is possible to establish an electrical conduction between the wiring substrate 2 and the semiconductor device 8.

In FIG. 1, the contactor 1 includes the anisotropic conductive sheet 4 provided between the wiring substrate 2 and the multilayer substrate 5. However, another example of the contactor of the related art may include an anisotropic conductive sheet provided between a wiring substrate and a semiconductor device.

Also, there is provided a contactor with greater contact pressure (adhesive force) between the wiring substrate and the semiconductor device. This is achieved by providing a seal member between a base member on which the semiconductor device wafer is mounted and the wiring substrate. A negative pressure is built up in an area sealed with the sealing member so that the wiring substrate will be pressed against the semiconductor wafer under atmospheric pressure.

There are two forces required for connecting the wiring substrate 2 to the semiconductor device 8. One of the forces is a pressure required for connecting the contact electrodes 3 provided on the wiring substrate 2 to the terminals of the semiconductor device 8. This force is hereinafter referred to as a contact pressure. The other force is a pressure required for maintaining the wiring substrate 2 in position with the base member 6. This force is hereinafter referred to as a position maintaining force.

Since the contact pressure and the position maintaining force have different functions, as has been described above, it is necessary to adjust each force to a strength appropriate for the respective functions.

That is to say, the contact pressure should be adjusted for providing a good electrical connection between the contact electrodes 3 of the wiring substrate 2 and the terminals of the semiconductor device 8, thus preventing any deformation of the contact electrodes 3 and the terminals. Also, the position maintaining force should be adjusted to a value sufficient for preventing any offset of the positioning of the wiring substrate 2 and the base member 6 when there is a certain external force being applied.

Therefore, for electrically connecting the wiring substrate 2 and the semiconductor device 8 in an ideal state, normally, it is necessary that the strength of the position maintaining force be greater than that of the contact pressure.

However, with the contactor 1 of the related art, the contact pressure and the position maintaining force cannot be adjusted independently. With such a structure, the wiring substrate and the semiconductor devices may be electrically connected by the above-described negative pressure. Then, if the negative pressure is released in order to release the contact pressure, the position maintaining force is also released. Accordingly, there is a drawback that the wiring substrate and the semiconductor devices are offset from the predetermined positions.

Also, with the contactor 1 of the related art, the contact pressure and the position maintaining force are the same force. When it is attempted to increase the position maintaining force, the contact pressure will also be increased, thus creating a risk of the terminals of the semiconductor device being seriously damaged.

Further, with the contactor 1 of the related art, the flexibility of the wiring substrate 2 is provided by the elasticity of the anisotropic conductive sheet 4 and thus is limited to such elasticity. Therefore, it is not possible to compensate for any variation of heights of the contact electrodes 3 and the terminals which variation exceeds the elasticity of the anisotropic conductive sheet 4. Accordingly, when there is any variation of the heights of the fine-pitched terminals, the contact electrodes 3 cannot be connected to all of the terminals of the semiconductor device 8.

SUMMARY OF THE INVENTION

Accordingly, it is a general object of the present invention to provide a semiconductor device contactor which can solve the problems described above. It is another and more specific object of the present invention to provide a semiconductor device contactor which can securely connect contact electrodes to a semiconductor device having fine terminals and can prevent the terminals and the contact electrodes from being damaged.

In order to achieve the above objects according to the present invention, a semiconductor device contactor includes a base unit for holding a semiconductor device provided with a plurality of terminals and a wiring substrate provided with contact electrodes at positions corresponding to at least some of the terminals. The contact electrodes and the terminals are electrically connected when the wiring substrate is held on the base unit.

The semiconductor device contactor further includes: a position maintaining force applying mechanism for applying a position maintaining force between the base unit and the wiring substrate; and a contact pressure applying mechanism for applying a contact pressure between the semiconductor device and the wiring substrate. The position maintaining force applying mechanism and the contact pressure applying mechanism are operable in an independent manner.

With the contactor described above, it is possible to prevent a mutual influence between the contact pressure and the position maintaining force. Thus, it is possible to independently applying an optimum position maintaining force and an optimum contact pressure. Accordingly, a precise positioning between the wiring substrate and the base unit and a stable contact state between the semiconductor device and the wiring substrate can be achieved.

It is still another object of the present invention to provide a testing device for obtaining a stable contact force.

In order to achieve the above object, the testing device includes a semiconductor device contactor as described above and a chamber for accommodating the semiconductor device contactor. The chamber is constructed such that its internal atmosphere may be of a positive pressure.

With the testing device described above, even if the contact pressure resulting from the negative pressure is insufficient, the contact pressure can be relatively increased by applying a high pressure in an atmosphere of the chamber. Thus, a stable contact pressure can be obtained.

It is yet another object of the present invention to provide a method of testing a semiconductor device using a semiconductor device contactor described above, which method can implement an accurate positioning and a secure connection of the contact electrodes of the wiring substrate to the terminals of the semiconductor device.

In order to achieve the above object, the testing method includes the steps of:

a) calculating a position correction value by recognizing the positions of the terminals and the electrodes, and then calculating the offset between the positions of the terminals and the contact electrodes;

b) positioning the wiring substrate with the base unit based on the position correction value;

c) driving, after the step b), the position maintaining force applying mechanism for applying a position maintaining force between the wiring substrate and the base unit;

d) driving the contact pressure applying mechanism for applying a contact pressure between the wiring substrate and the semiconductor device; and e) testing the semiconductor device.

With the testing method described above, an accurate positioning can be achieved by the steps a) and b). Also, a secure connection of the contact electrodes to the terminals can be achieved since, after positioning, first, the wiring substrate and the base unit are fixed by means of the position maintaining force applying mechanism and, then, the contact pressure is applied between the wiring substrate and the semiconductor device by means of the contact pressure applying mechanism.

It is yet another object of the present invention to provide a method of cleaning the semiconductor device contactor described above which method can remove unwanted layers disposed on the contact electrodes and thus achieve a stable contact state.

In order to achieve the above object, a method of cleaning a contactor for semiconductor devices, particularly cleaning contact electrodes provided on a wiring substrate provided on the contactor, includes the steps of:

a) providing a cleaning member instead of the semiconductor device on the base unit, such that the cleaning member is in contact with the contact electrodes for cleaning the contact electrodes;

b) holding the wiring substrate on the base unit by driving the position maintaining force applying mechanism;

c) repeatedly driving and ceasing the contact pressure applying mechanism while the wiring substrate is held on the base unit.

With the cleaning method described above, unwanted layers disposed on the contact electrodes can be remove and thus a stable contact state can be achieved.

Other objects and further features of the present invention will be apparent from the following detailed description when read in conjunction with the accompanying drawings.

BRIEF DESCRIPTION OF THE DRAWINGS

FIGS. 2A to 2C are cross-sectional diagrams showing a contactor of a first embodiment of the present invention taken along line I—I in FIG. 3.

FIG. 6 is a cross-sectional diagram showing a contactor of a fourth embodiment of the present invention.

DETAILED DESCRIPTION OF THE PREFERRED EMBODIMENTS

Figure 1:
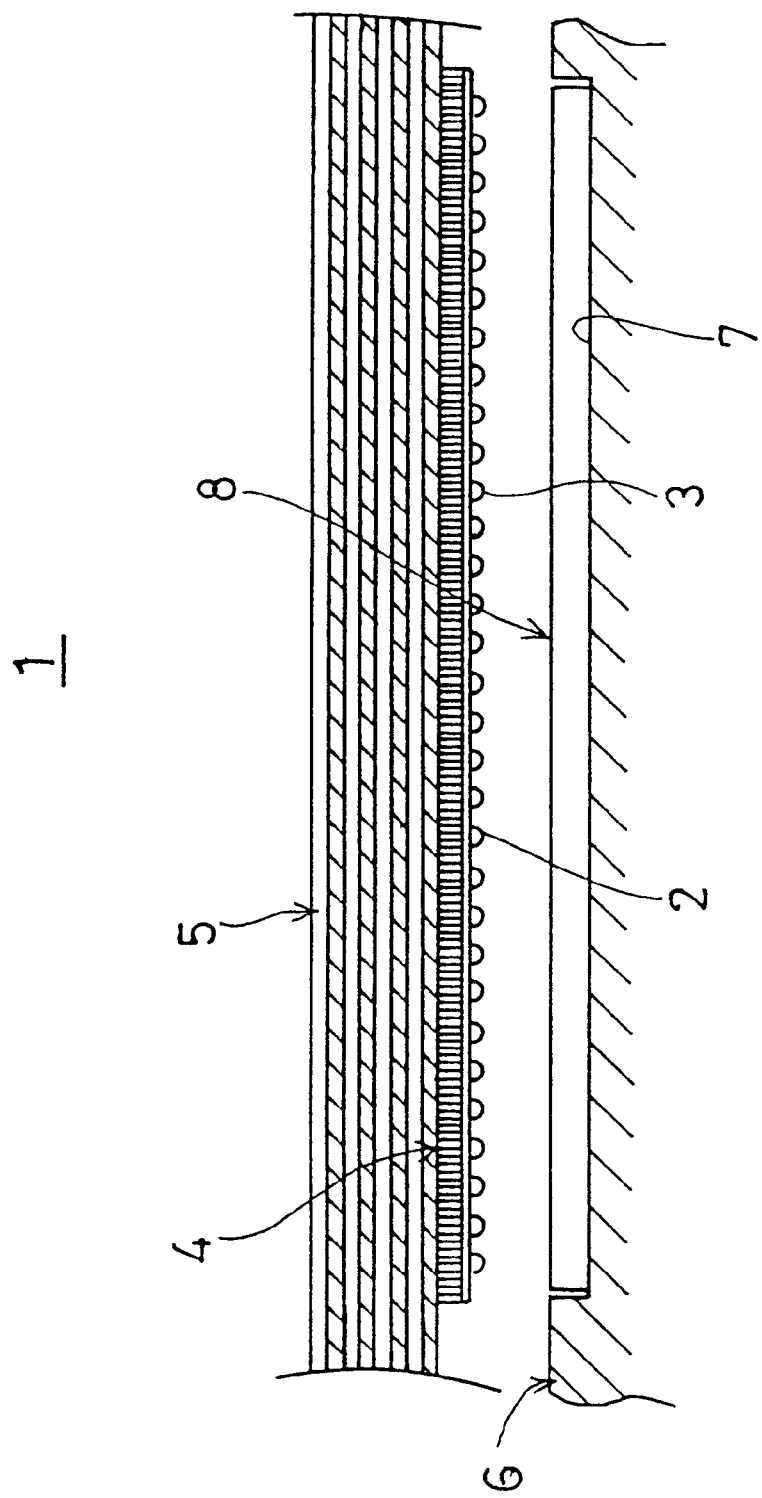
FIG. 1 is a cross-sectional diagram showing a contactor of the related art.

In the following, principles and embodiments of the present invention will be described with reference to the accompanying drawings.

FIGS. 2A to 2C and FIG. 3 are cross-sectional diagrams showing a semiconductor device contactor 10A (the semiconductor device contactor is hereinafter simply referred to as a contactor) of a first embodiment of the present invention.

Note that contactors 10A to 10I of the embodiments described later may be applied to any types of semiconductor chip and semiconductor device (hereinafter both are generically referred to as a semiconductor device) such as a wafer, a bare-chip, BGA (Ball Grid Array), an SOP (Small Outline Package) and a QFP (Quad Flat Package). However, in the following description, by way of example, a semiconductor device 20 is described as a wafer.

The contactor 10A generally includes a wiring substrate 11A and a base unit 12A.

The wiring substrate 11A includes a wiring pattern, not shown, provided on a base film 13. The base film 13 is, for example, made of a resin such as polyimide (PI) and has a thickness of about 25 to 100 $\mu$m. The wiring pattern is made of an electrically conductive material such as a copper foil or an aluminum foil patterned into a predetermined configuration. Also, the wiring pattern is provided with contact electrodes 14 which may be electrically connected to terminals 21 provided on the semiconductor device 20 (see FIGS. 9A and 9B).

The wiring substrate 11A is configured such that a region in which the contact electrodes 14 will be connected to the terminals 21 of the semiconductor device 20 is flexible. Hereinafter, this region will be referred to as a connection region 18. In order to give flexibility to the connection region 18, the thickness of the base film 13 may be reduced at a corresponding area. Also, the wiring substrate 11A is given a predetermined rigidity at a peripheral area of the connection region 18.

The base unit 12A may be made of metal, such as aluminum and stainless steel, or of hard resin. The base unit 12A is provided with a recessed mounting part 15 in which the semiconductor device 20 can be mounted. The base unit 12A is further provided with a contact pressure applying mechanism 16 and a position maintaining force applying mechanism 17.

The contact pressure applying mechanism 16 generally includes a first seal member 24 and a first suction pipe 26.

Figure 3:
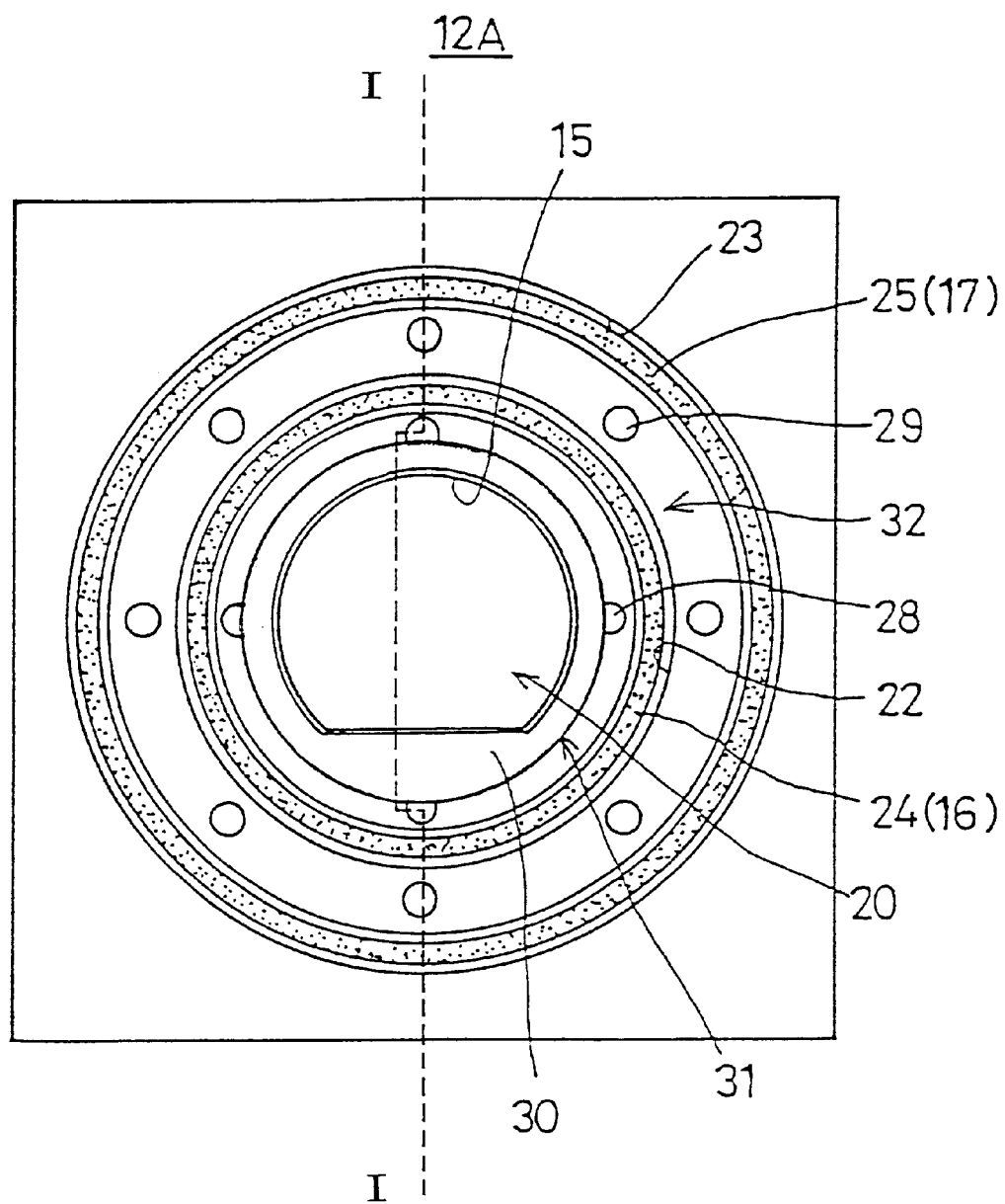
FIG. 3 is a plan view showing a base unit constituting the contactor of the first embodiment of the present invention.

The first seal member 24 may be an O-ring. As shown in FIG. 3, the first seal member 24 is provided on the base unit 12A and surrounds the semiconductor device 20 mounted on the mounting part 15. In detail, the first seal member 24 is provided in a first recessed part 22 which is formed in the base unit 12A and surrounds the mounting part 15.

Figure 2B:
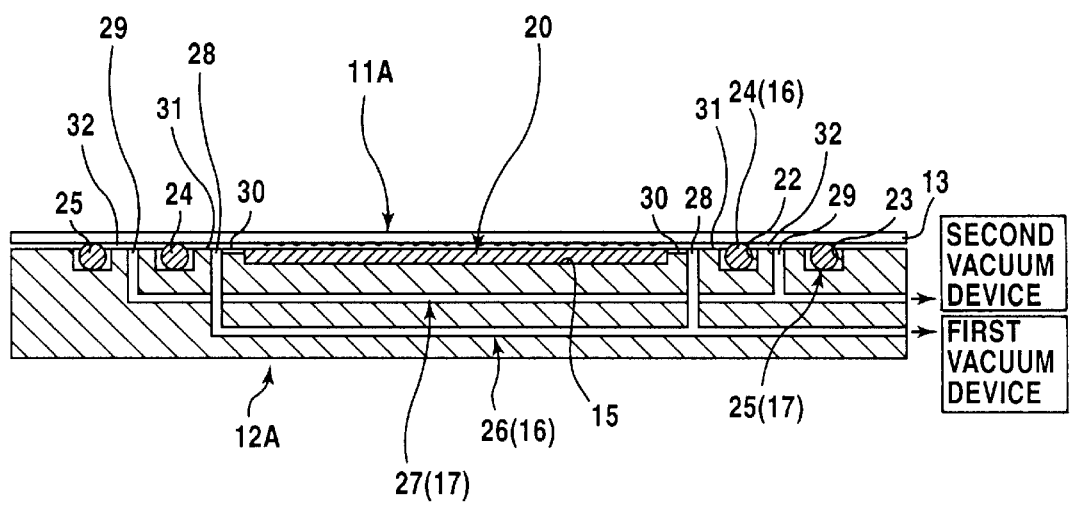

Also, the first seal member 24 is provided in such a manner that it slightly protrudes from the top surface of the base unit 12A. Therefore, as shown in FIGS. 2B and 2C, when the wiring substrate 11A is mounted on the base unit 12A, the first seal member 24 touches the wiring pattern 11A in a hermetic manner.

In other words, when the wiring substrate 11A is mounted on the base unit 12A, the wiring substrate 11A, the base unit 12A and the first seal member 24 enclose a sealed spatial region. Hereinafter, the sealed spatial region will be referred to as a first closed region 31. The area of the first closed region 31 is provided so as to cover at least the above-described connection region 18.

Also, the first suction pipe 26 is provided inside the base unit 12A. One end of the first suction pipe 26 opens at a position between the mounting part 15 and the first seal member 24. In other words, the first suction pipe 26 opens on a surface on which the semiconductor device 20 is mounted. Hereinafter, this opening will be referred to as a contact pressure opening 28. Therefore, the contact pressure opening 28 opens in the first closed region 31. Also, in the present embodiment, as shown in FIG. 3, four contact pressure openings 28 are provided in the first closed region 31.

The other end of the first suction pipe 26 extends at a side surface of the base unit 12A and is connected to a first vacuum device. Therefore, by driving the first vacuum device, the first closed region 31 is vacuumed via the first suction pipe 26. Thus, a negative pressure is built up in the first closed region 31.

It is to be noted that a communication stepped portion 30 is formed at a peripheral position of the mounting part 15. The communication stepped portion 30 is slightly recessed from the upper surface of the base unit 12A. Thus, the mounting part 15 is also included in the first closed region 31 and a negative pressure is applied inside the mounting part 15. Further, the negative pressure within the first closed region 31 and the mounting part 15 can be adjusted to any value by controlling the first vacuum device.

As has been described above, the first closed region 31 covers the connection region 18. When the first vacuum device is driven with the wiring substrate 11A being mounted on the first seal member 24, the first closed region 31 will be brought to a negative pressure. The connection region 18 of the wiring substrate 11A will be pressed towards the semiconductor device 20. Therefore, the contact electrodes 14 of the wiring substrate 11A can be pressed to the terminals 21 of the semiconductor device 20.

Here, the negative pressure applied by the contact pressure applying mechanism 16 serves as a contact pressure for pressing the contact electrodes 14 of the wiring substrate 11A to the terminals 21 of the semiconductor device 20. Also, as has been described above, the contact pressure can be adjusted to any value by controlling the first vacuum device. When the power of the first vacuum device is constant, the contact pressure may be controlled by a structure in which a number and radius of the contact pressure openings 28 can be adjusted.

The position maintaining force applying mechanism 17 of the present embodiment generally includes a second seal member 25 and a second suction pipe 27. The second seal member 25 may be an O-ring. As shown in FIG. 3, the second seal member 25 is provided on the base unit 12A and surrounds the first seal member 24. In detail, the second seal member 25 is provided in a second recessed part 23 which is formed in the base unit 12A and surrounding the first seal member 24.

Also, the second seal member 25 is provided in such a manner that it slightly protrudes from the top surface of the base unit 12A. The second seal member 25 is protruded substantially by an equal amount to that of the first seal member 24. Therefore, as shown in FIGS. 2B and 2C, when the wiring substrate 11A is mounted on the base unit 12A, the first and second seal members 24, 25 contact the wiring pattern 11A in a hermetic manner.

In other words, when the wiring substrate 11A is mounted on the base unit 12A, a sealed spatial region is created by the wiring substrate 11A, the base unit 12A, the first seal member 24 and the second seal member 25. Hereinafter, the sealed spatial region will be referred to as a second closed region 32. The second closed region 32 is a completely independent region since it is hermetically separated from the first closed region 31 by means of the first seal member 24.

Also, a second suction pipe 27 is provided inside the base unit 12A. One end of the second suction pipe 27 opens at a position between the first seal member 24 and the second seal member 25. Hereinafter, this opening will be referred to as a position maintaining force opening 29. Therefore, the position maintaining force opening 29 opens in the second closed region 32. Also, in the present embodiment, as shown in FIG. 3, eight position maintaining force openings 29 are provided in the second closed region 32.

The other end of the second suction pipe 27 extends at a side surface of the base unit 12A and is connected to a second vacuum device. Therefore, by driving the second vacuum device, the second closed region 32 is vacuumed via the second suction pipe 27. Thus, a negative pressure is built up in the second closed region 32.

The first and second vacuum devices may be integrated as a single device, but it is necessary that the first suction pipe 26 and the second suction pipe 27 can be independently adjusted to their respective degrees of vacuum.

In the above-described structure, when the second vacuum device is driven with the wiring substrate 11A being mounted on the first and second seal members 24, 25, the second closed region 32 will be brought to a negative pressure. The wiring substrate 11A will be pressed towards the base unit 12A. Therefore, the wiring substrate 11A can be held (fixed) on the base unit 12A.

Here, the negative pressure applied by the position maintaining force applying mechanism 17 serves as a contact pressure for fixedly holding the wiring substrate 11A on the base unit 12A. Also, as has been described above, the position maintaining force can be adjusted to any value by controlling the second vacuum device. Further, since the first and second closed regions 31, 32 are hermetically defined as describe above, it is possible to independently adjust the contact pressure applied in the first closed region 31 and the position maintaining force applied in the second closed region 32. When the power of the second vacuum device is constant, the contact pressure may be controlled by a structure in which a number and radius of the position maintaining force openings 29 can be adjusted.

In order to implement a contact process of the semiconductor device 20 using the contactor 10A, first, the semiconductor device 20 is mounted on the mounting part 15 of the base unit 12A. Then, the wiring substrate 11A is placed on the base unit 12A in such a manner that the wiring substrate 11A is positioned against the semiconductor device 20. In this state, the first and second seal members 24, 25 are in contact with the wiring substrate 11A.

Subsequently, the second vacuum device is driven so as to generate the position maintaining force (negative pressure) in the second closed region 32. The position maintaining force is adjusted to a value sufficient for securely holding the wiring substrate 11A on the base unit 12A.

Thus, the wiring substrate 11A can be securely held on the base unit 12A. However, there is no contact pressure (negative pressure) applied to the first closed region 31. Also, since the first closed region 31 is completely independent of the second closed region 32, the connection region 18 of the wiring substrate 11A will be separated from the semiconductor device 20.

Then, in order to connect the contact electrodes 14 of the wiring substrate 11A and the terminals 21 of the semiconductor device 20, the first vacuum device is driven so as to generate the contact pressure (negative pressure) in the first closed region 31. The contact pressure is adjusted to a value suitable for connecting the contact electrodes 14 and the terminals 21. Thus, a good connecting state may be achieved between the contact electrodes 14 and the terminals 21. Also, the contact electrodes 14 and the terminals 21 will not be damaged during the connecting process.

Further, in the present embodiment, the connection region 18 having the contact electrodes 14 has greater flexibility than other parts. Therefore, when the contact pressure is applied, the connection region 18 will be uniformly connected to all of the terminals 21 of the semiconductor device 20. Therefore, even if, as in the present embodiment, the wafer is used as the semiconductor device 20 and thus there are a large number of terminals, the contact electrodes 14 of the wiring substrate 11A can be positively connected to all of the terminals 21, respectively.

As has been described above, in the contactor 10A of the present embodiment, the contact pressure applying mechanism 16 and the position maintaining force applying mechanism 17 are provided independently. Note that the contact pressure applying mechanism 16 produces the contact pressure between the semiconductor device 20 and the wiring substrate 11A, and the position maintaining force applying mechanism 17 produces the position maintaining force between the base unit 12A and the wiring substrate 11A. Therefore, the position maintaining force and the contact pressure can be controlled (operated) independently.

The contact pressure and the position maintaining force are prevented from influencing each other. Therefore, the optimal position maintaining force for holding the wiring substrate 11A on the base unit 12A and the optimal contact pressure for connecting the semiconductor device 20 to the wiring substrate 11A can be generated independently. Thus, it is possible to achieve the accurate positioning between the wiring substrate 11A and the base unit 12A. Also, it is possible to keep the semiconductor device 20 and the wiring substrate 11A in a secure and stable contact state.

Also, in the present embodiment, the negative pressure is used as the contact pressure between the semiconductor device 20 and the wiring substrate 11A. Therefore, the wiring substrate 11A can be uniformly connected to the semiconductor device 20. That is to say, the contact pressure (i.e., negative pressure) in the first closed region 31 is uniformly applied to the inner wall of the first closed region 31.

Thus, since a uniform contact pressure (negative pressure) is applied to the entire surface of the wiring substrate 11A, the wiring substrate 11A can be uniformly connected to the semiconductor device 20. Therefore, even if the semiconductor device 20 is provided with a larger number of terminals, all of the terminals 21 can be securely connected to the contact electrodes 14, respectively.

Similarly, in the present embodiment, the negative pressure is also used as the position maintaining force, so that the position maintaining force (negative pressure) is uniformly applied to the entire inner surface of the second closed region 32. Therefore, the wiring substrate 11A can be held on the base unit 12A with the uniform position maintaining force. Therefore, the wiring substrate 11A can be prevented from being tilted during mounting, and this can also achieve a stable contact state.

In the embodiment described above, a single wafer is used as the semiconductor device 20. However, it is also possible that a plurality of the above-described semiconductor devices are mounted on the mounting part 15 and the wiring substrate is totally and simultaneously connected to the plurality of the semiconductor devices. Thus, when the semiconductor device 20 is tested with such a structure, it is possible to improve a testing efficiency.

In the following, a contactor of a second embodiment of the present invention will be described with reference to FIGS. 4A and 4B.

Figure 4A:
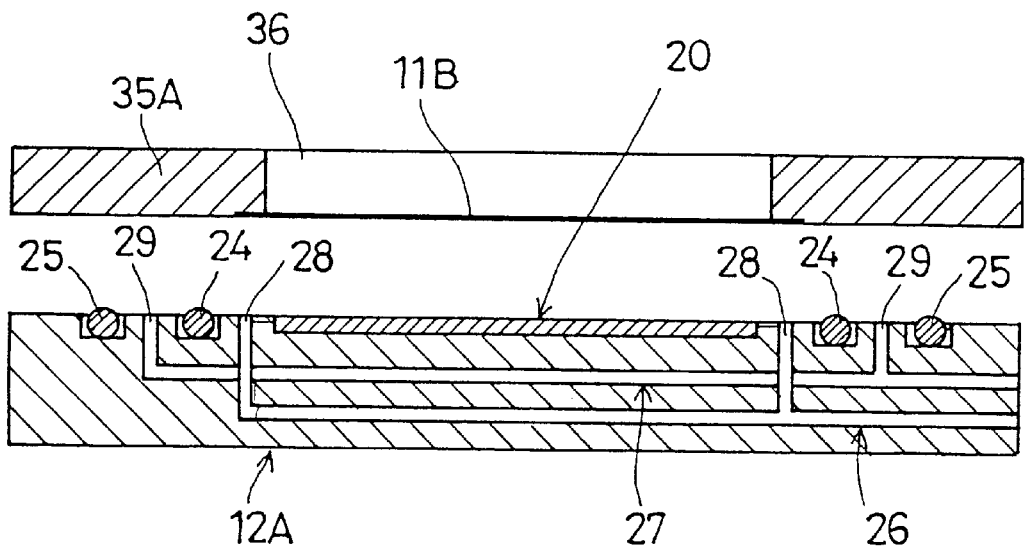
FIGS. 4A and 4B are cross-sectional diagrams showing a contactor of a second embodiment of the present invention.
Figure 4B:
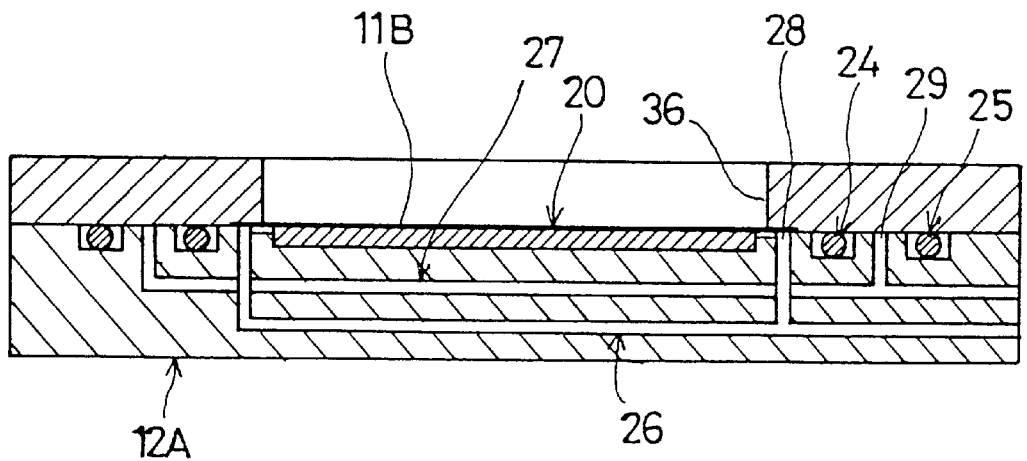

FIGS. 4A and 4B are cross-sectional diagrams showing a contactor 10B related to the second embodiment of the present invention. In FIGS. 4A and 4B, the same structures as those described for the contactor 10A of the first embodiment in FIGS. 2A to 2C and FIG. 3 will be indicated with the same reference numerals and detailed a description thereof will be omitted. This also applies to each of the embodiments described below.

As has been described, with the above-described contactor 10A of the first embodiment, the wiring substrate 11A is directly mounted (by suction force) on the base unit 12A. On the contrary, the contactor 10B of the second embodiment is characterized in that there is provided a cover unit 35A for holding the wiring substrate 11B.

In order to minimize the influence of thermal expansion, the cover unit 35A is made of the same material as that of the base unit 12A. Also, a cover unit opening 36 is provided in the central part of the base unit 12A at an area corresponding to the connection region 18 of the wiring substrate 11B.

Further, the wiring substrate 11B of the present embodiment differs from the wiring substrate 11A used in the first embodiment in that the wiring substrate 11B is entirely flexible. Thus, since the wiring substrate 11B has an entirely uniform structure, it is possible to reduce the cost as compared to the wiring substrate 11A. The wiring substrate 11B is fixed on the lower surface (the surface opposing the base unit 12A) of the cover unit 35A by, for example, an adhesive agent.

When it is attempted to mount the entire flexible wiring substrate 11B on the base unit 12A without using the cover unit 35A, the wiring substrate 11B will be considerably deformed due to a great position maintaining force particularly at the second closed region 32. Accordingly, the connection region 18 will also be deformed so that it is not possible to achieve a good connection. For this reason, the wiring substrate 11A used in the first embodiment is configured such that the peripheral part of the connection region 18 is rigid.

In the present embodiment, the entire flexible wiring substrate 11B is provided on the cover unit 35A. Therefore, it is possible to connect the wiring substrate 11B to the semiconductor device 20 with a predetermined contact pressure. Also, since the cover unit 35A is provided with the cover unit opening 36 at a position opposing the connection region 18, the wiring substrate 11B remains flexible in the connection region 18.

Thus, when the wiring substrate 11B is held on the cover unit 35A, the contact electrode 14 of the wiring substrate 11B can be positively connected to all of the terminals 21 of the semiconductor device 20. Further, as shown in FIG. 4B, the second closed region 32, in which the position maintaining force is applied, opposes the lower surface of the cover unit 35A. Therefore, even if the position maintaining force is increased, there will be no deformation produced in the wiring substrate 11B. Therefore, the wiring substrate 11B can be positively held on the base unit 12A.

In the following, a contactor of a third embodiment of the present invention will be described with reference to FIG. 5.

Figure 5:
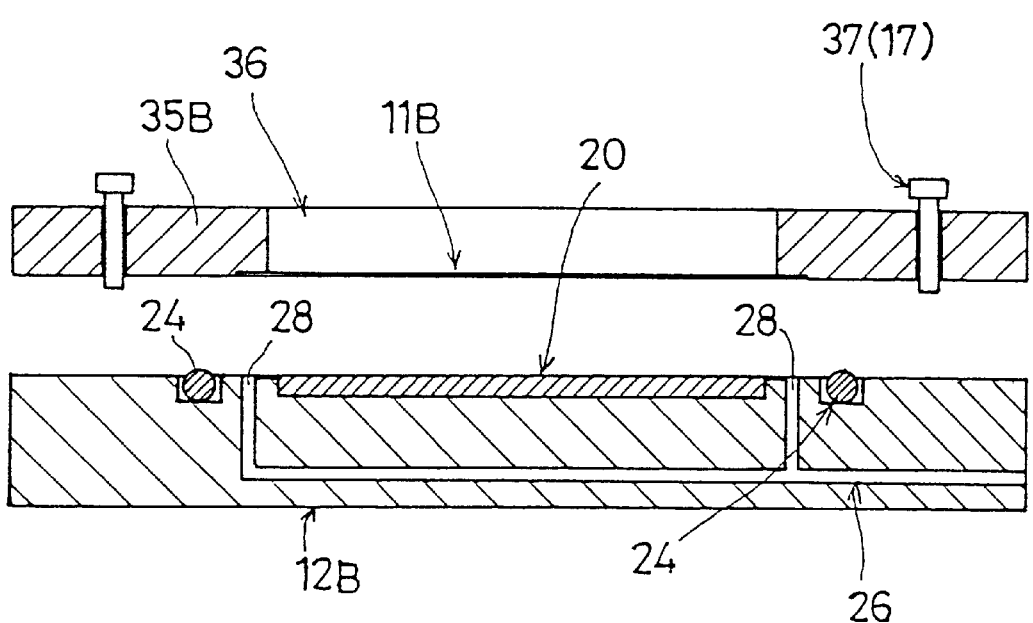
FIG. 5 is a cross-sectional diagram showing a contactor of a third embodiment of the present invention.

FIG. 5 is a cross-sectional diagram showing the contactor 10C of the third embodiment.

With the above-described contactor 10A and 10B of the first and second embodiments, a negative pressure is used for the position maintaining force applying mechanism 17. The contactor 10C of the third embodiment is characterized in that a fastening mechanism is used for the position maintaining force applying mechanism 17.

Here, the fastening mechanism is defined as a mechanism for holding the wiring substrate on the base unit by means of a mechanically produced force. There are various types of fastening mechanisms, but in the present embodiment, the fastening mechanism is realized by screws 37. These screws will be hereinafter referred to as position maintaining force applying screws.

The position maintaining force applying screw 37 is penetrated through a through hole provided in the cover unit 35B. Also, the base unit 12B is provided with screw holes in which the position maintaining force applying screws 37 may be screwed. Then, the cover unit 35B is mounted on the base unit 12B with the wiring substrate 11B being positioned with the semiconductor device 20, and the position maintaining force applying screw 37 is fastened. Thus, the cover unit 35B (the wiring substrate 11B) will be held on the base unit 12B. Also, the position maintaining force can be adjusted by fastening the position maintaining force applying screw 37.

In the present embodiment, a fastening force produced by the position maintaining force applying screws 37 serves as the position maintaining force between the wiring substrate 11B and the base unit 12B. Thus, the position maintaining force applying mechanism 17 of a comparatively simple and cost effective structure can be achieved.

In the following, a contactor of a fourth embodiment of the present invention will be described with reference to FIG. 6.

FIG. 6 is a cross-sectional diagram showing the contactor 10D of the fourth embodiment of the present invention. The present embodiment is characterized in that the position maintaining force applying mechanisms of the first and second embodiments using the negative pressure and that of the third embodiment using a fastening mechanism are combined.

As shown in the present embodiment, the position maintaining force applying mechanisms of the first and second embodiments using the negative pressure and that of the third embodiment using a fastening mechanism may be appropriately combined. It is not necessary to provide the position maintaining force applying mechanisms individually.

In the following, a contactor of a fifth embodiment of the present invention will be described with reference to FIGS. 7A and 7B.

Figure 7A:
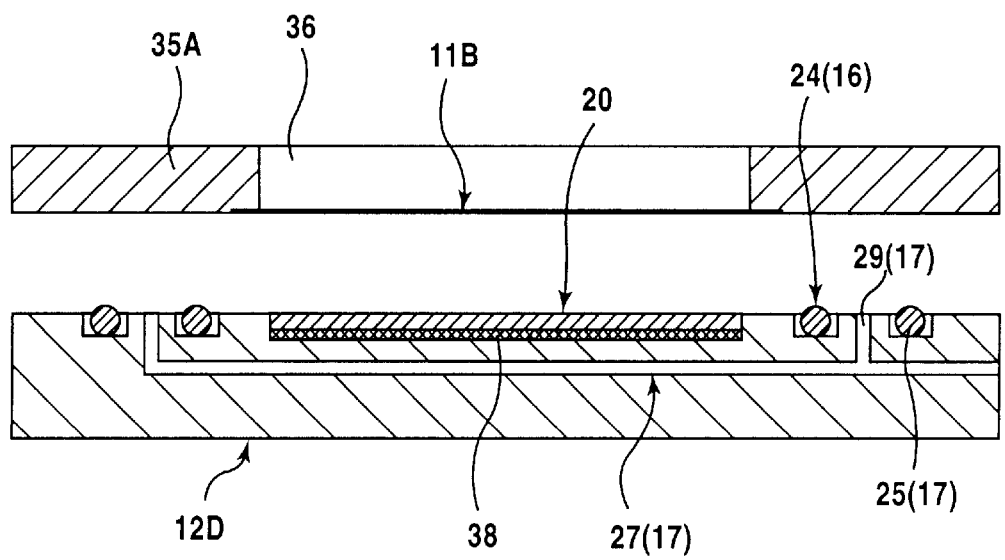
FIGS. 7A and 7B are cross-sectional diagrams showing a contactor of a fifth embodiment of the present invention.
Figure 7B:
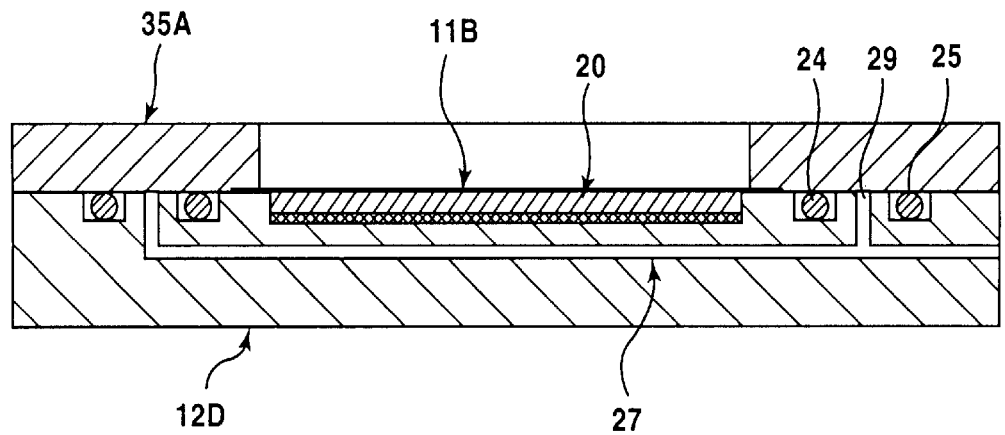

FIGS. 7A and 7B are cross-sectional diagrams showing the contactor 10E of the fifth embodiment. The contactor 10E of the present embodiment is characterized in that the contact pressure applying mechanism 16 is used as a lifting mechanism.

Here, the lifting mechanism is defined as a mechanism for applying a contact pressure by moving the semiconductor unit 20 mounted on the mounting part 15 towards the wiring substrate 11B. In the present embodiment, the lifting mechanism is realized by a lifting element 38 such as a piezoelectric element whose thickness may be electrically altered.

The lifting element 38 is provided at the lower part of the mounting part 15 of the base unit 12D. Thus, when the voltage is applied to the lifting element 38, the semiconductor device 20 place on the lifting element 38 will move upwards. Also, by ceasing the voltage application, the semiconductor device 20 will move downwards.

Then, when the semiconductor device 20 is pressed to the wiring substrate 11B held by the position maintaining force applying mechanism 17, this pressure force will serve as the contact pressure. It is to be noted that the position maintaining force applying mechanism 17 includes the first and second seal member 24, 25, the second suction pipe 27, and the position maintaining force opening 29.

Therefore, the contact pressure can be applied between the semiconductor device 20 and the wiring substrate 11B by means of the lifting element 38 (lifting mechanism). Also, by using the contact pressure applying mechanism 16 as the lifting mechanism as in the present embodiment, it is possible to produce the contact pressure between the semiconductor device 20 and the wiring substrate 11B with a comparatively simple structure. Note that the contact pressure can be adjusted by controlling the voltage applied to the lifting element 38.

In the following, a contactor of a sixth embodiment of the present invention will be described with reference to FIGS. 8A and 8B.

Figure 8A:
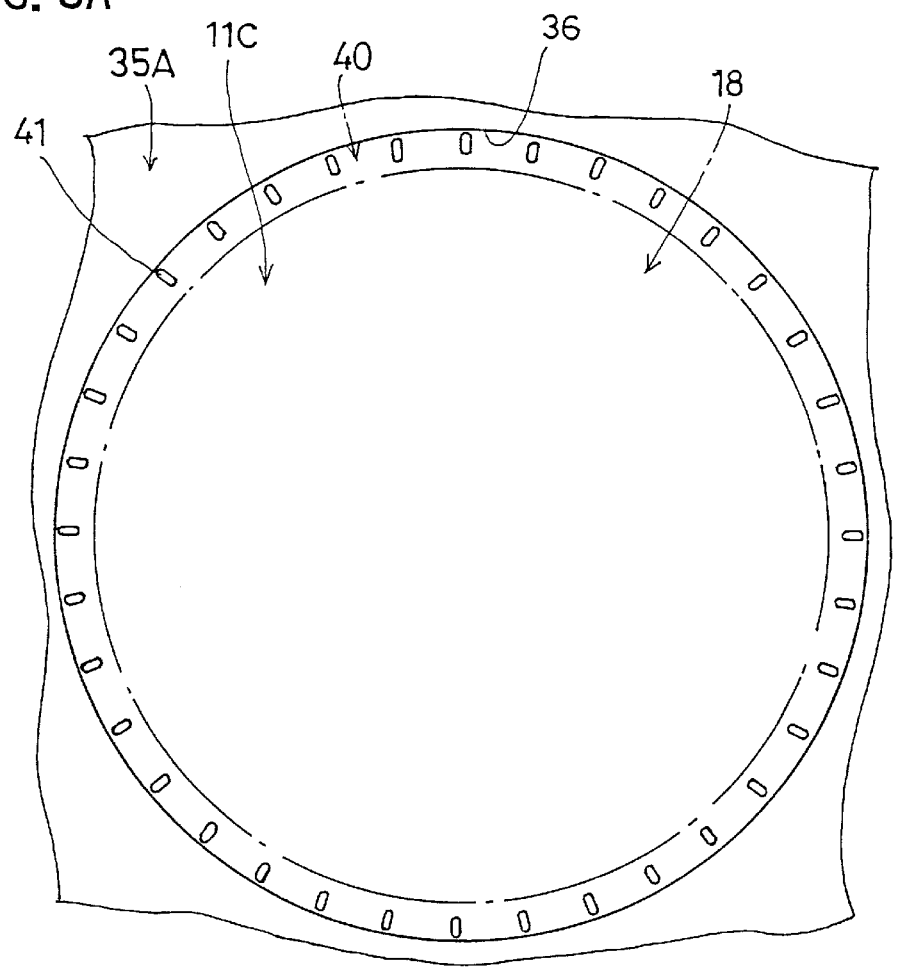
FIGS. 8A and 8B are a plan view and a cross-sectional diagram, respectively, showing a contactor of a sixth embodiment of the present invention.
Figure 8B:
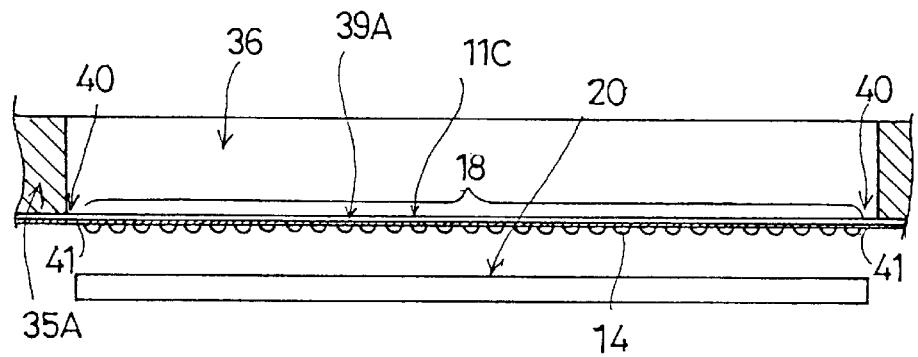

FIGS. 8A and 8B are diagrams showing a wiring substrate 11C provided on the contactor of the sixth embodiment. FIG. 8A is a flat enlarged diagram showing a neighborhood of the cover unit opening 36 of the cover unit 35A on which the wiring substrate 11C is provided. FIG. 8A is a cross-sectional diagram showing the cover unit 35A on which the wiring substrate 11C is provided.

The present embodiment is characterized in that a deformable part 40 is provided at a peripheral part of the connection region 18 of the wiring substrate 11C. Again, the connection region 18 is a region in which the contact electrodes 14 are connected to the terminals 21 of the semiconductor device 20. In the present embodiment, the deformable part 40 is constructed by a plurality of small holes 41 provided along the periphery of the connection region 18.

The small holes 41 may be formed by various methods including etching, punching, and laser processing. In the present embodiment, in order to prevent the negative pressure from being lost due to the small holes 41, a back-up sheet 39A is provided on the back surface of the wiring substrate 11C.

Thus, with the deformable part 40 formed of the small holes 41, the peripheral part of the wiring substrate 11C will be more flexible. Thus, it is possible to further stabilize the contact with the semiconductor device 20. It is to be noted that the position of the deformable part 40 is not limited to the peripheral part of the connection region 18, but may also be at the position opposing the region in which the terminals 21 of the semiconductor device 20 are not formed. Also, the deformable part 40 is not limited to a structure using the small holes 41, but can be achieved by reducing the thickness of the base film 13 by, for example, etching.

In the following, a contactor of a seventh embodiment of the present invention will be described with reference to FIGS. 9A and 9B.

Figure 9A:
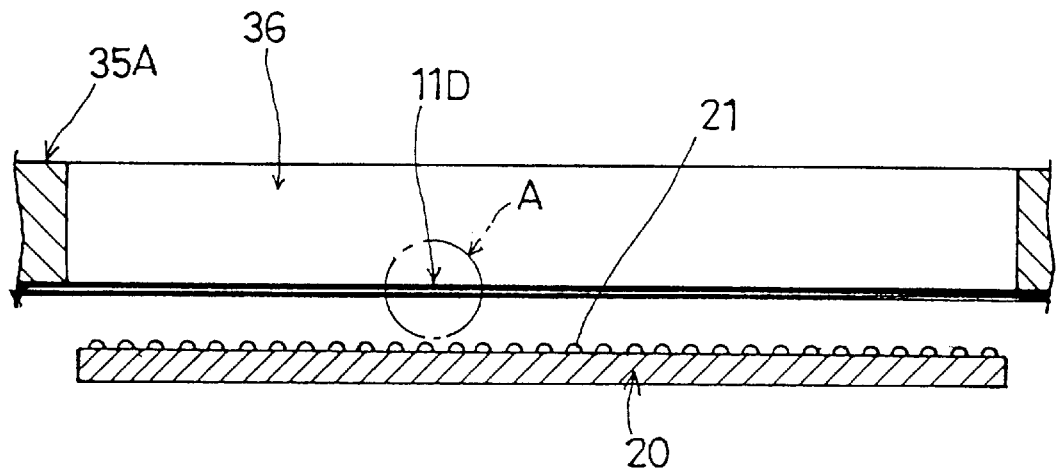
FIGS. 9A and 9B are cross-sectional diagrams showing a contactor of a seventh embodiment of the present invention.
Figure 9B:
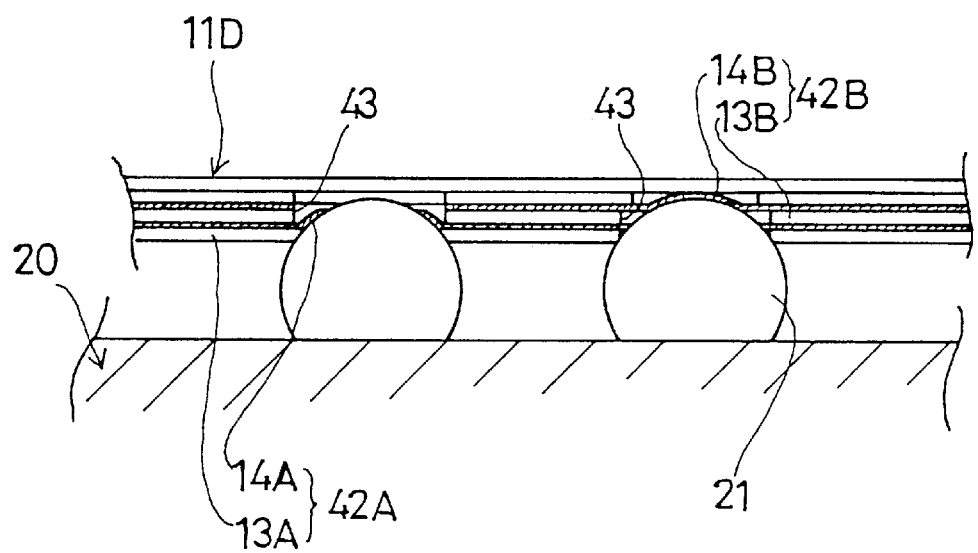

FIGS. 9A and 9B are enlarged cross-sectional diagrams showing a wiring substrate 11D provided on the contactor of the seventh embodiment. FIG. 9A is an enlarged diagram showing a neighboring part of the cover unit opening 36 of the cover unit 35A on which the wiring substrate 11D is provided. FIG. 9B is an enlarged diagram showing the wiring substrate 11D being in a connected state with the terminals 21 of the semiconductor device 20.

In the present embodiment, the wiring substrate 11D includes a plurality of laminated wiring layers. In the figure, two wiring layers 42A, 42B are illustrated. The wiring layers 42A, 42B are provided with contact electrodes 14A, 14B which are selectively connected to the terminals 21 of the semiconductor device 20. The contact electrodes 14A, 14B are provided on respective base films 13A, 13B. Also, in the present embodiment, the terminals 21 of the semiconductor device 20 are configured as bumps.

The wiring substrate 11D is provided with insert holes 43 provided at predetermined positions to be connected to the terminals 21 of the semiconductor device 20. The contact electrodes 14A, 14B to be connected to the terminals 21 corresponding to the insert hole positions are provided so as to extend in the insert holes 43. Therefore, when the wiring substrate 11D is electrically connected to the semiconductor device 20, the terminals 21 made of bumps will be inserted in the insert holes 43. Thereby the terminals 21 will be connected to the predetermined contact electrodes 14A, 14B, thus achieving an electrical conduction.

Therefore, according to the structure of the present embodiment, an increased number of contact electrodes 14A, 14B can be provided compared to a single layered wiring substrate. Therefore, the contactor can still be used with the high-density semiconductor device 20 having an increased number of terminals.

In the following, a contactor of an eighth embodiment of the present invention will be described with reference to FIG. 10.

Figure 10:
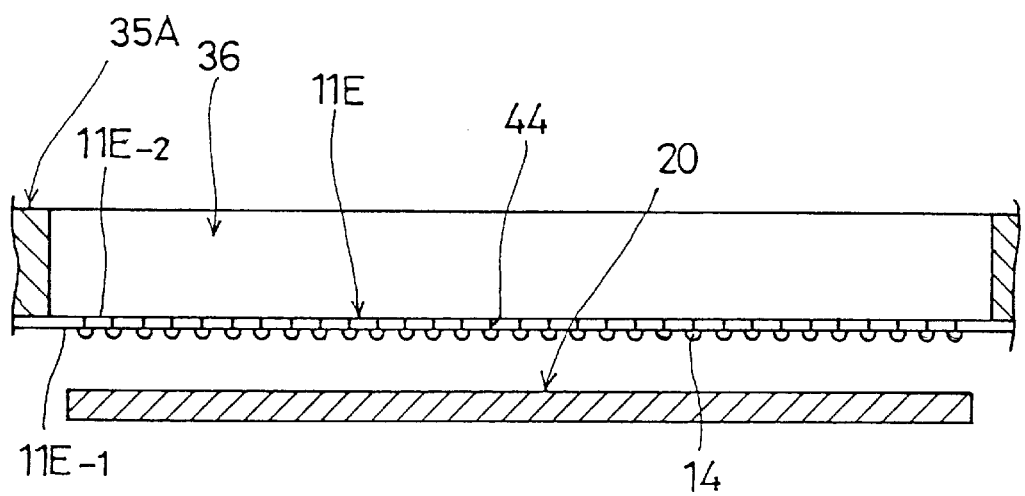
FIG. 10 is a cross-sectional diagram showing a contactor of an eighth embodiment of the present invention.

FIG. 10 is an enlarged cross-sectional diagram showing a wiring substrate 11E provided on the contactor of the eighth embodiment. In the present embodiment, the wiring substrate 11E is provided with through holes 44 serving as conducting parts. The surface of the wiring substrate 11E on which the semiconductor is connected will be referred to as a connecting surface 11E-1. The surface opposite to the connecting surface 11E-1 will be referred to as an opposite surface 11E-2. The present embodiment is characterized in that the connecting surface 11E-1 and the opposite surface 11E-2 are electrically connected by the through holes 44.

With such a structure having through holes 44 provided in the wiring substrate 11E, it is possible to establish an electrical connection with the semiconductor device 20 from the opposite surface 11E-2 of the wiring substrate 11E, or, through the cover unit opening 36 of the cover unit 35A. Thus, it is possible to implement a test on the semiconductor device 20 from the opposite surface 11E-2 of the wiring substrate 11E.

In the following, a contactor of a ninth embodiment of the present invention will be described with reference to FIG. 11.

Figure 11:
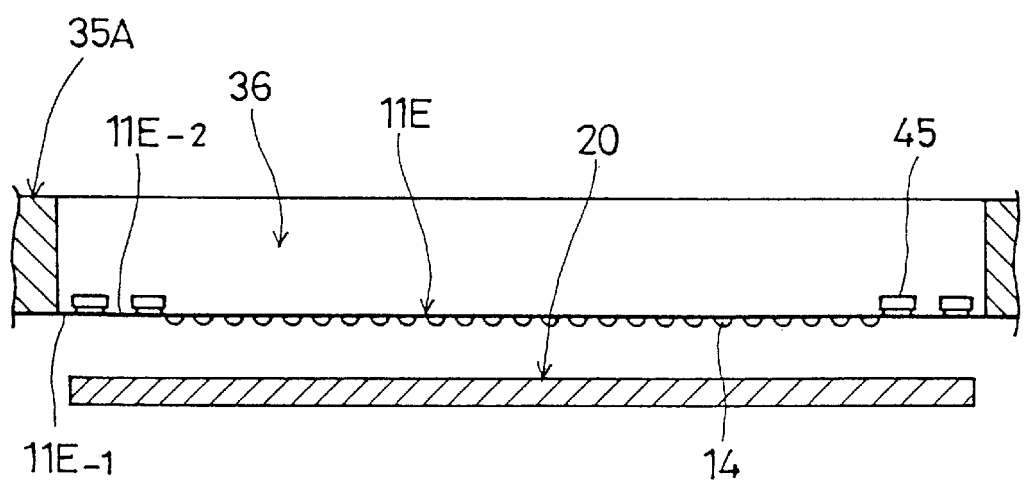
FIG. 11 is a cross-sectional diagram showing a contactor of a ninth embodiment of the present invention.

FIG. 11 is an enlarged cross-sectional diagram showing the wiring substrate 11E provided on the contactor of the ninth embodiment. The present embodiment is characterized in that the wiring substrate 11E used in the eighth embodiment is utilized together with electronic components 45 mounted on the opposite surface 11E-2. Here, the electronic components 45 may be elements such as a capacitor, a resistor, a fuse, and a self burn-in circuit.

Thus, by mounting the electronic components 45 on the opposite surface 11E-2, the wiring substrate itself has a function of implementing a test on the semiconductor device 20. Thus, it is possible to implement a more multi-functional semiconductor device test.

In the following, a contactor of a tenth embodiment of the present invention will be described with reference to FIGS. 12A and 12B.

Figure 12A:
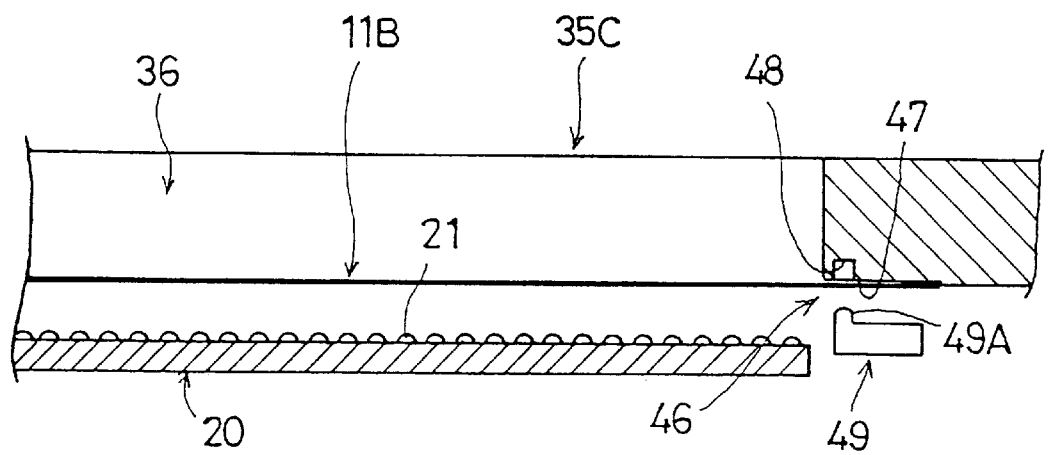
FIGS. 12A and 12B are cross-sectional diagrams showing a contactor of a tenth embodiment of the present invention.
Figure 12B:
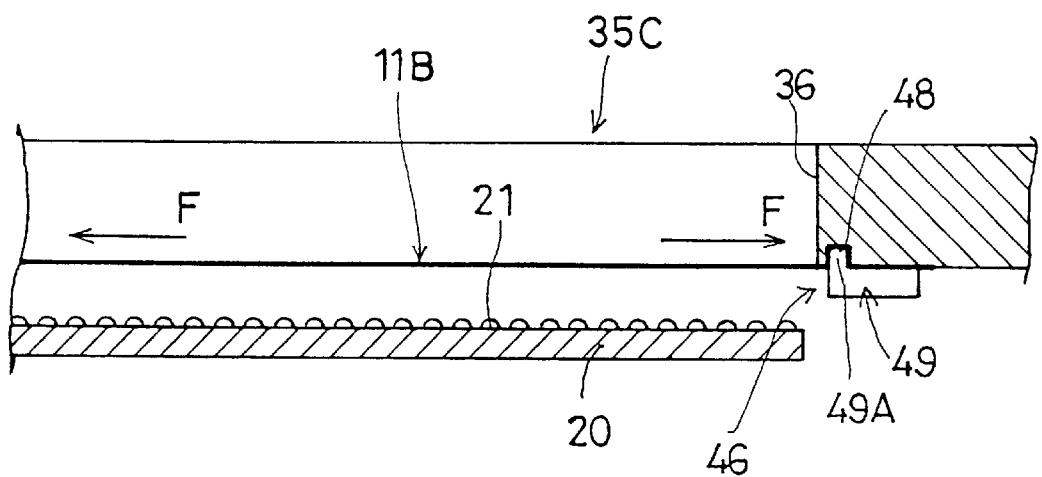

FIGS. 12A and 12B are enlarged cross-sectional diagrams showing the wiring substrate 11B provided on the contactor of the tenth embodiment. The present embodiment is characterized in that a tension applying mechanism 46 is provided for applying a predetermined tension F on the wiring substrate 11B.

The tension applying mechanism 46 includes a tapered surface 47, an accommodation recess 48 and a protruded component 49. The tapered surface 47 is provided on the surface of the cover unit 35C opposing the base unit 12A (not shown in FIGS. 12A and 12B). The accommodation recess 48 is formed at a part of the tapered surface 47. The protruded component 49 has a protrusion 49A to be fitted into the accommodation recess 48.

In FIG. 12A, the protruded component 49 is not yet fitted in the accommodation recess 48. In this state, there is a gap formed between the wiring substrate 11B and the tapered surface 47.

Also, when the protrusion 49A of the protruded component 49 is fitted into the accommodation recess 48 in the state shown in FIG. 12A, a part of the wiring substrate 11B will be inserted into the accommodation recess 48 together with the protrusion 49A as shown in FIG. 12B. Thereby, the tension F is produced in the wiring substrate 11B which can then pull any looseness produced in the wiring substrate 11B. Therefore, it is possible to implement a stable positioning of the wiring substrate 11B against the semiconductor device 20.

In the following, a contactor of an eleventh embodiment of the present invention will be described with reference to FIG. 13.

Figure 13:
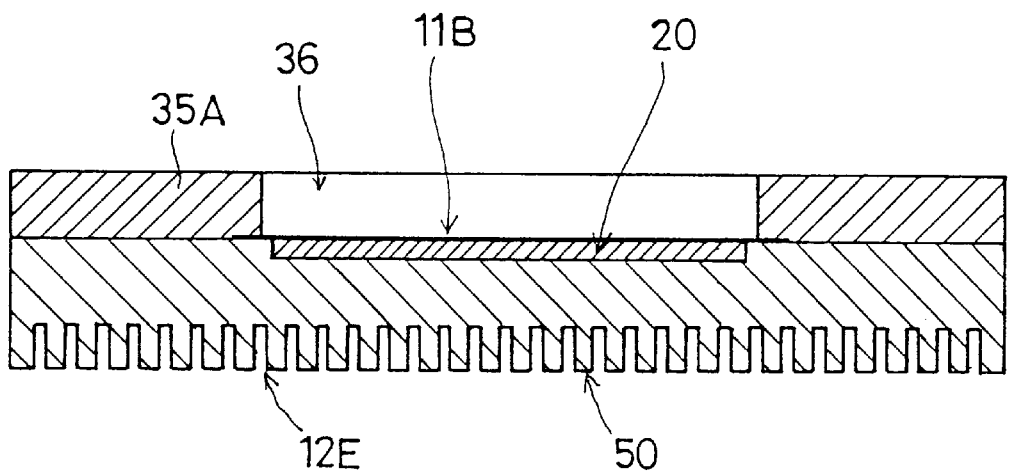
FIG. 13 is a cross-sectional diagram showing a contactor of an eleventh embodiment of the present invention.

FIG. 13 is a cross-sectional diagram showing the contactor 10F of the eleventh embodiment. For the sake of convenience, the contact pressure applying mechanism 16 and the position maintaining force applying mechanism 17 are omitted from the figure.

The present embodiment is characterized in that a base unit 12E has a heat dissipation function. The base unit 12E is made of a material with good thermal conductivity and is provided with a heat dissipation fin part 50. With this structure, when testing the semiconductor device 20 using the contactor 10F, any heat produced in the semiconductor device 20 can be rapidly dissipated.

In the following, a contactor of a twelfth embodiment of the present invention will be described with reference to FIG. 14.

Figure 14:
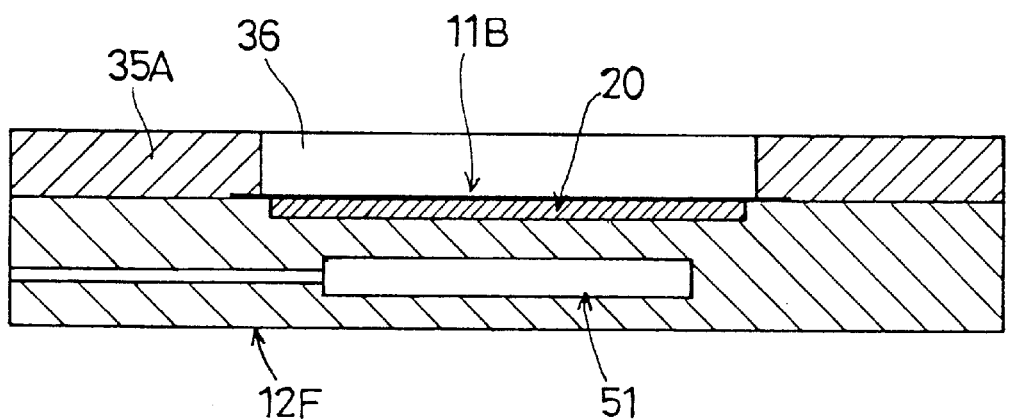
FIG. 14 is a cross-sectional diagram showing a contactor of a twelfth embodiment of the present invention.

FIG. 14 is a cross-sectional diagram showing the contactor 10G of the twelfth embodiment. For the sake of convenience, the contact pressure applying mechanism 16 and the position maintaining force applying mechanism 17 are omitted from the figure.

The present embodiment is characterized in that a base unit 12E is provided with a temperature controlling device 51. The temperature controlling device 51 internally includes at least one of a temperature applying mechanism, a heat absorption mechanism and a temperature detecting mechanism.

Thus, with the temperature controlling device 51 provided in the base unit 12F, the temperature of the semiconductor device 20 during the test can be adjusted to a proper temperature. Also, it is possible to adjust any positioning offset due to thermal expansion of the base unit 12F. The temperature applying mechanism may be an electric heater and the heat absorption mechanism may be, for example, a Peltier element.

In the following, a contactor of a thirteenth embodiment of the present invention will be described with reference to FIG. 15.

Figure 15:
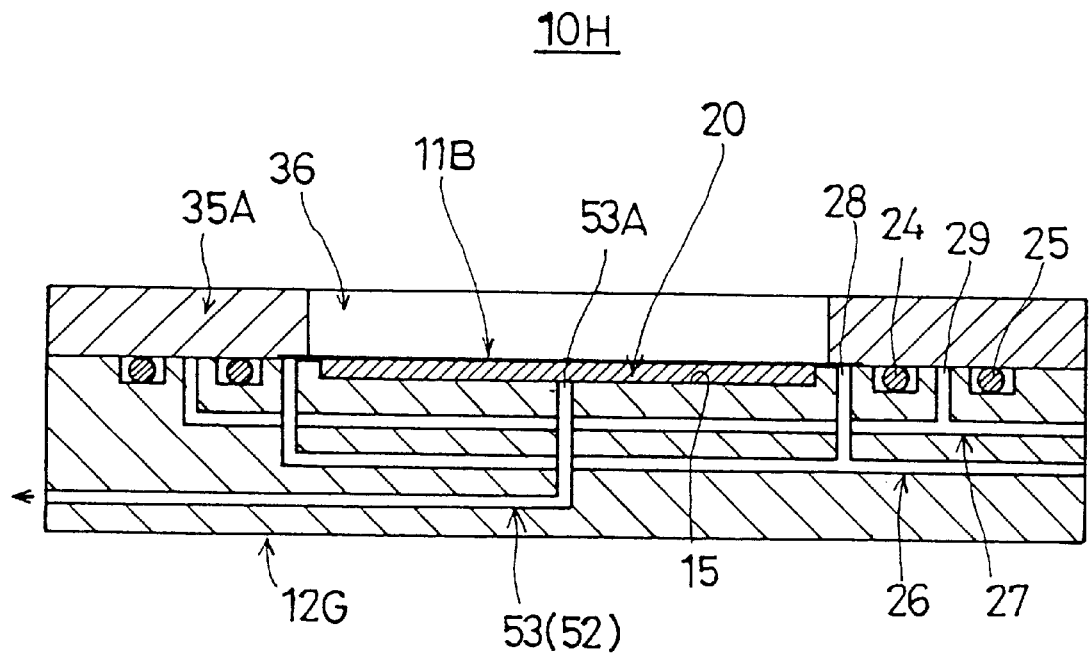
FIG. 15 is a cross-sectional diagram showing a contactor of a thirteenth embodiment of the present invention.

FIG. 15 is a cross-sectional diagram showing the contactor 10H of the thirteenth embodiment. The contactor 10H of the present embodiment is characterized in that a base unit 12G is provided with a holding mechanism 52 for forcing the semiconductor device 20 to be held on the mounting part 15.

In the present embodiment, the holding mechanism 52 is formed by a holding suction pipe 53 provided in the base unit 12G. One end of the holding suction pipe 53 opens in the mounting part 15. Hereinafter, the opening will be referred to as a semiconductor device holding opening 53A. The other end of the holding suction pipe 53 is pulled out at a side surface of the base unit 12G and is connected to a third vacuum device which is not shown in the Figure.

Therefore, by driving the third vacuum device, the semiconductor device 20 mounted on the mounting part 15 is vacuumed at the semiconductor device holding opening 53A. Thus, the semiconductor device 20 is held on the base unit 12G.

Thus, by providing the holding mechanism 52, the semiconductor device 20 can be fixed to the base unit 12G before positioning the wiring substrate 11B (cover unit 35A) and the base unit 12G. Thereafter, the semiconductor device 20 is prevented from being displaced in the mounting part 15, so that the positioning can be achieved with a higher accuracy. (Note that there a small gap between the mounting part 15 and the semiconductor device 20 for facilitating the attachment and removal of the semiconductor device 20.)

Also, as in the present embodiment, when the wafer is used as the semiconductor device 20, there may be a warp in the wafer. In order to deal with such a case, a plurality of the semiconductor device holding openings 53A can be formed in the mounting part. Thus, the back surface of the mounted wafer (semiconductor device 20) may be entirely and uniformly vacuumed so as to correct the warp of the wafer (semiconductor device 20).

In the following, a contactor of a fourteenth embodiment of the present invention will be described with reference to FIG. 16.

Figure 16:
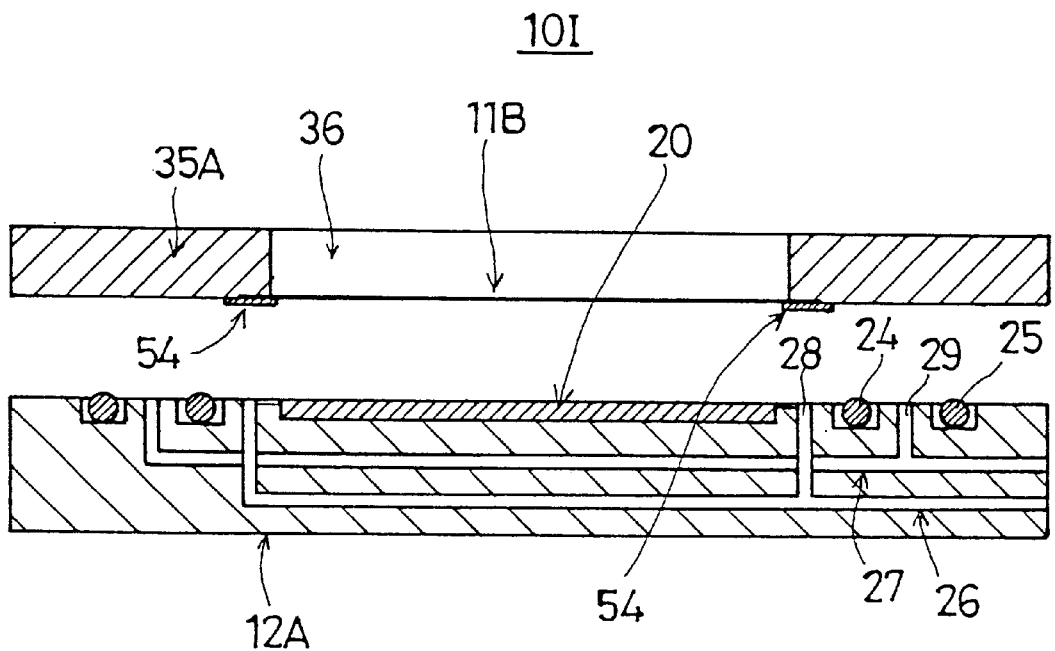
FIG. 16 is a cross-sectional diagram showing a contactor of a fourteenth embodiment of the present invention.

FIG. 16 is a cross-sectional diagram showing the contactor 10I of the fourteenth embodiment. The contactor 10I of the present embodiment is characterized in that at least one of the wiring substrate 11B, the cover unit 35A, and the base unit 12A is provided with a friction increasing part for increasing the friction produced between the wiring substrate 11B (cover unit 35A) and the base unit 12A.

In the present embodiment, the friction increasing part is a friction increasing sheet 54 having a comparatively high friction coefficient (e.g., rubber) at the surface. Also, the friction increasing sheet 54 is provided around the wiring substrate 11DB.

In the present embodiment, the friction increasing sheet 54 serves as the friction increasing part. However, the friction increasing part is not limited but can be made by directly forming a coarse surface on the cover unit and the base unit.

In the following, a contactor of a fifteenth embodiment of the present invention will be described with reference to FIG. 17.

Figure 17:
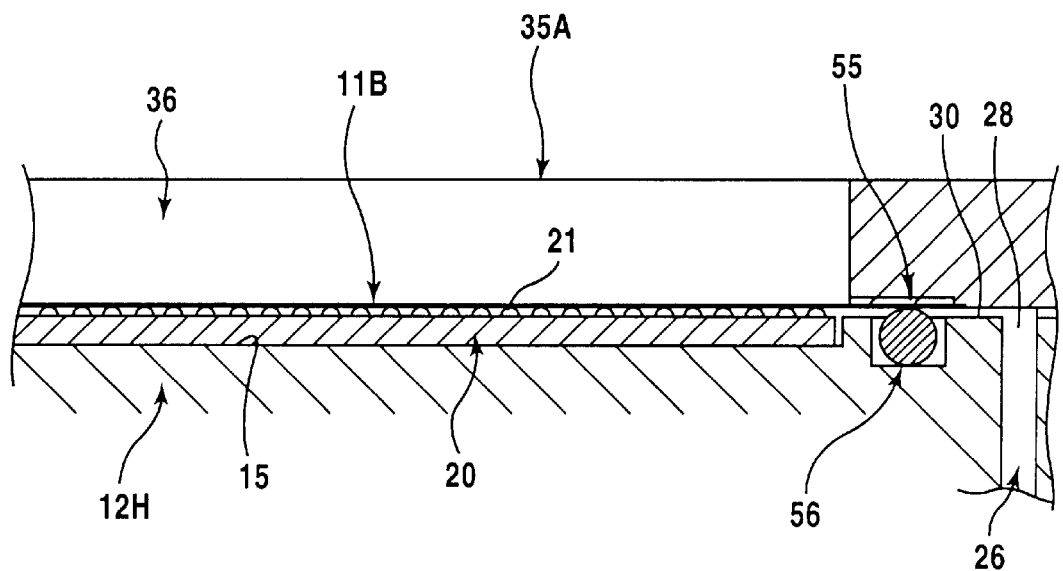
FIG. 17 is a cross-sectional diagram showing a contactor of a fifteenth embodiment of the present invention.

FIG. 17 is an enlarged diagram showing a neighborhood of the wiring substrate 11B provided on the contactor of the fifteen the embodiment.

The contactor 10I of the present invention is provided with a third seal member 55 between the wiring substrate 11B and the cover unit 35A and a fourth seal member 56 provided in a base unit 12H. When the wiring substrate 11B is held on the base unit 12H, the wiring substrate 11B is sandwiched between the third and fourth seal members 55, 56.

The third seal member 55 is a sheet-like seal member, and can be made of resin of such as a silicon type or a fluorine type. The fourth seal member 56 is for example sphere-like and can be made of a resin of such as the silicon type or the fluorine type.

In the present embodiment, the fourth seal member 56 is provided in the contact pressure opening 28 of the first suction pipe 26. However, since the fourth seal member 56 is spherical, the contact pressure opening 28 communicates with the mounting part 15 via the communication stepped part 30. Therefore, when applying the contact pressure in the first closed region 31, the fourth seal member 56 will not be obstructive.

Thus, with the wiring substrate 11B being sandwiched between the third and fourth seal members 55, 56, it is possible to improve the sealing ability between the wiring substrate 11B and the cover unit 35A. Therefore, the contact pressure can be positively produced in the first closed region 31, so that the wiring substrate 11B can be securely connected to the semiconductor device 20.

In the following, a contactor of a sixteenth embodiment of the present invention will be described with reference to FIG. 18.

Figure 18:
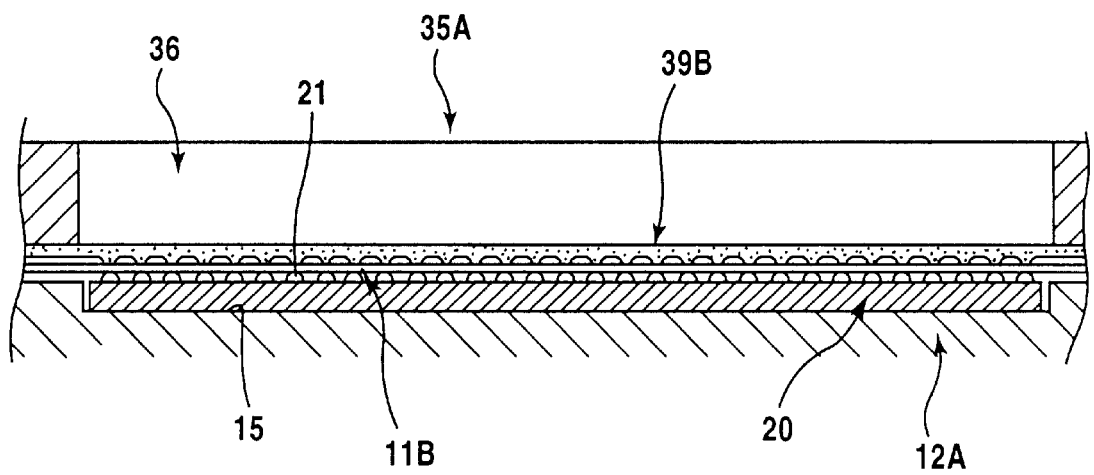
FIG. 18 is a cross-sectional diagram showing a contactor of a sixteenth embodiment of the present invention.

FIG. 18 is an enlarged diagram showing a neighborhood of the wiring substrate 11B provided on the contactor of the sixteenth embodiment. The present embodiment is characterized in that a back-up sheet 39B having protrusions and recesses is provided on the opposite surface of the wiring substrate 11B (the surface opposite to the surface connected to the semiconductor device 20).

The back-up sheet 39B is made of an elastic material such as silicon rubber and is provided with protrusions at positions opposing the contact electrodes 14. With the back-up sheet 39B having a certain elasticity, any variation between the heights of the terminals 21 of the semiconductor device 20 or the contact electrodes 14 of the wiring substrate 11B will be compensated for by a deformation of the back-up sheet 39B. Also, the back-up sheet 39B will produce an elastic restoration force by being pressed with the terminals 21. Therefore, this elastic restoration force serves as the contact pressure. Thus, in the present embodiment, since the contact pressure is also produced in the back-up sheet 39B, it is possible to implement a more stable connection.

Figure 19:
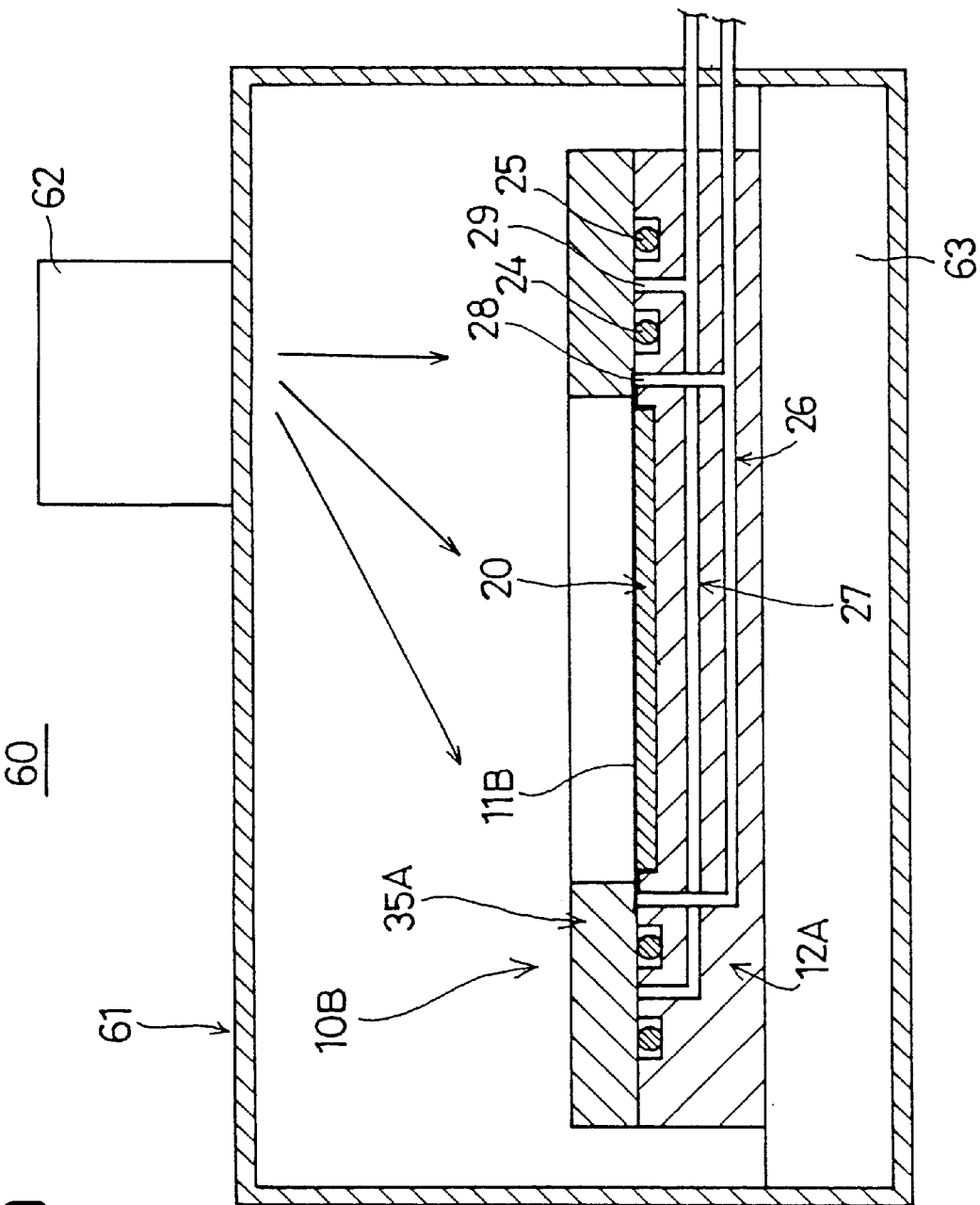
FIG. 19 is a cross-sectional diagram showing a testing apparatus of one embodiment of the present invention, the testing apparatus utilizing a contactor.

In the following, a testing apparatus using a contactor of one embodiment of the present invention will be described. FIG. 19 is schematic diagram of a testing apparatus 60 of an embodiment of the present invention.

The testing apparatus 60 includes the contactor 10B, a testing apparatus chamber 61 and a compressed air producing device 62. The contactor 10B is the contactor of the second embodiment described above by reference to FIG. 4. The contactor available for the testing apparatus 60 is not limited to the contactor 10B of the second embodiment, but can be any one of the contactors described above.

The testing apparatus chamber 61 is an airtight container and the contactor 10B is installed therein. With the contactor 10B being installed in the testing apparatus chamber 61, the first and second suction pipe 26, 27 extend outside the testing apparatus 60 and are connected to the first and second vacuum devices. In the figure, the contactor 10B is mounted on a base table 63.

The compressed air producing device 62 includes a compression pump, and can introduce compressed air into the testing apparatus chamber 61. Therefore, by driving the compression air-producing device 62, the pressure within the testing apparatus chamber 61 will become a positive pressure.

The testing apparatus 60 of the present embodiment includes the testing apparatus chamber 61 having an internal atmosphere brought to a positive pressure by the compressed air producing device 62 provided thereon and the contactor 10B installed in the testing apparatus chamber 61. Therefore, it is possible to securely connect the contact electrodes 14 to the terminals 21 even when the contact pressure due to the negative pressure produced in the first closed region 31 is insufficient.

That is to say, when the positive pressure is produced in the testing apparatus chamber 61 by means of the compressed air generating device 62, this positive pressure causes a relatively great positive pressure produced in the first closed region 31. Note that the contact pressure is determined by an atmospheric pressure external to the first closed region 31 and the negative pressure generated by the first vacuum device. Therefore, as the atmosphere in the testing apparatus chamber 61 is brought to a higher pressure, the contact pressure will increase relatively. Thus, it is possible to obtain the contact pressure sufficient for connecting the contact electrodes 14 to the terminals 21 of the semiconductor device 20.

In the following, a testing method using the contactor of the first embodiment of the present invention will be described. In the following, the method of testing the semiconductor device 20 using the contactor 10B of the second embodiment illustrated in FIGS. 4A and 4B will be described. However, the method of the present invention is not limited to the contactor 10B of the second embodiment, but any one of the contactors of the above embodiments can be used.

Figure 20:
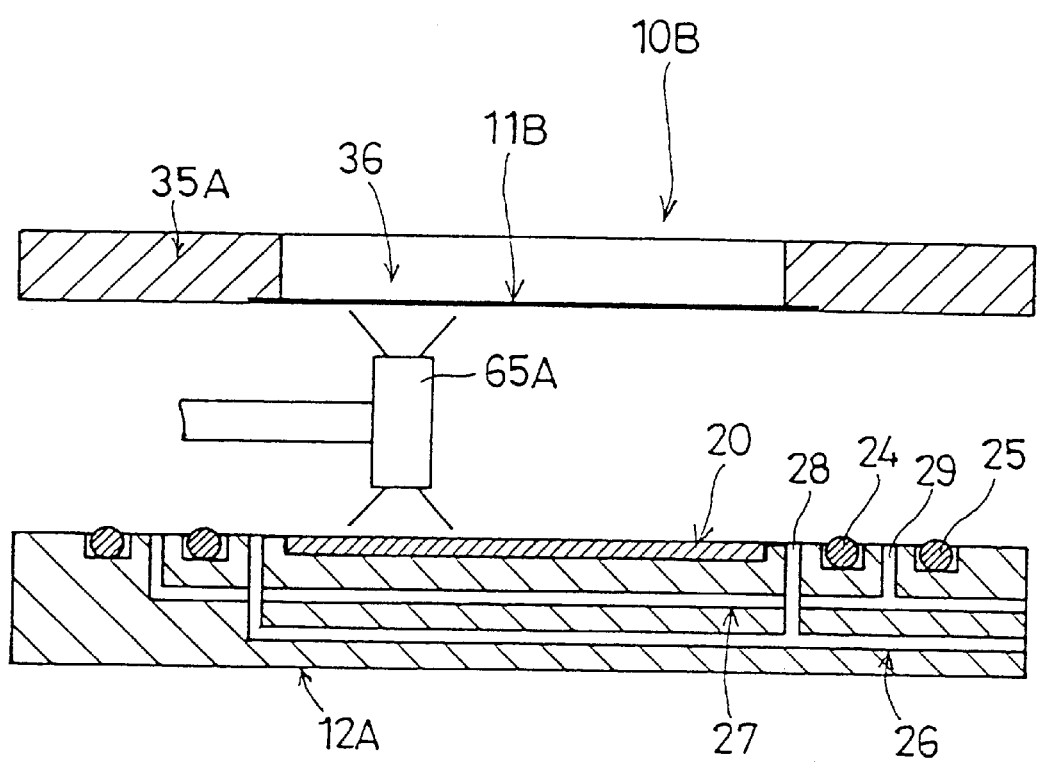
FIG. 20 is a cross-sectional diagram showing a testing apparatus utilizing the contactor of the first embodiment of the present invention.

In order to test the semiconductor device 20 using the contactor 10B, first, the semiconductor device 20 is mounted on the mounting part 15 of the base unit 12A. Then, as shown in FIG. 20, a position recognition process of the terminals 21 of the semiconductor device 20 and the contact electrodes 14 of the wiring substrate 11B is implemented by means of a CCD camera 65A. Here, the terminals 21 and the contact electrodes 14 are not shown in the figure.

Also, the CCD camera 65A of the present embodiment is capable of imaging both directions in its upper and lower side. Thereby, since the recognition process of the terminals 21 and the contact electrodes 14 can be implemented simultaneously, the time required for the recognition process is reduced.

After the position recognition process of the terminals 21 and contact electrodes 14, from the results of the position recognition process, a position offset between the terminals 21 and the contact electrodes 14 is detected and a position correction value is computed from the detected position offsets.

Then, based on the position correction value, the positioning of the wiring substrate 11B and the base unit 12A is implemented. When the positioning has been completed, the position maintaining force applying mechanism 17 is driven so as to produce a negative pressure in the second closed region 32. Thus, the position maintaining force is produced between the wiring substrate 11B (cover unit 35A) and the base unit 12A. Thereby, the wiring substrate 11 and the semiconductor device 20 will be maintained in a positioned state.

Then, while maintaining the state in which the position maintaining force is produced, the contact pressure applying mechanism 16 is driven so as to produce a negative pressure in the first closed region 31. Thus, the contact pressure is applied between the wiring substrate 11B and the semiconductor device 20. Thereby, the wiring substrate 11B will be connected to the semiconductor device 20 so that the predetermined test can be implemented.

As has been described above, the position recognition process of the terminals 21 of the semiconductor device 20 and the contact electrodes 14 is implemented. Then, the wiring substrate 11B and the semiconductor device 20 (base unit 12A) are positioned based on the position correction value obtained from the position recognition process. Thus, according to the testing method of the present embodiment, the positioning can be implemented with a comparatively high accuracy.

Also, in a state where the positioning has been implemented, first, the position maintaining force applying mechanism 17 is driven so as to apply a position maintaining force between the wiring substrate 11B and the base unit 12A. Thus, it is possible to fix the wiring substrate 11B to the base unit 12A before applying the contact pressure while maintaining the state in which the wiring substrate 11B and the semiconductor device 20 are positioned.

Therefore, when the contact pressure is applied between the wiring substrate 11B and the semiconductor device 20 by means of the contact pressure applying mechanism 16, there will be no position offset between the wiring substrate 11B and the semiconductor device 20. Thus, the terminals 21 of the semiconductor device 20 and the contact electrodes 14 of the wiring substrate 11B can be securely connected.

In the following, a testing method using the contactor of the second embodiment of the present invention will be described. In the description of the present embodiment, matters which are the same as those of the first embodiment will be omitted, and only the characteristic matters will be described.

In the testing method of the first embodiment, a CCD camera 65A is used which is capable of imaging both directions in its upper and lower side. The recognition process is implemented by moving this CCD camera 65A between the wiring substrate 11B and the semiconductor device 20. However, the CCD camera 65A which can image both directions in its upper and lower sides is expensive. Also, an operability is not particularly good when moving the CCD camera 65A between the wiring substrate 11B and the semiconductor device 20 during the recognition process.

Figure 21:
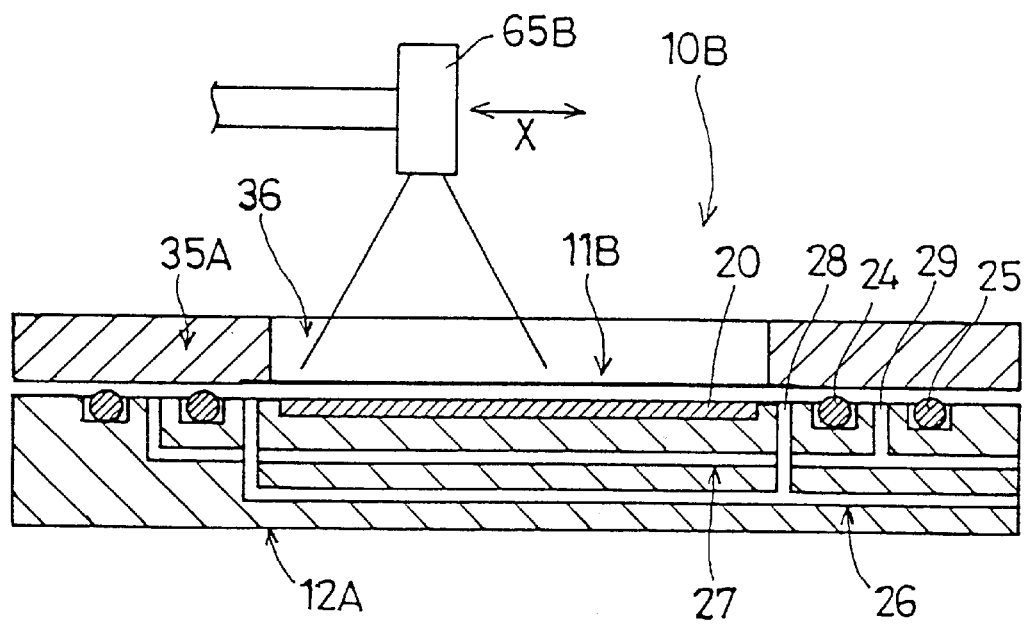
FIG. 21 is a cross-sectional diagram showing a testing apparatus utilizing the contactor of the second embodiment of the present invention.

Therefore, as shown in FIG. 21, the present embodiment is characterized in that a CCD camera 65B is placed above the cover unit 35A. Thus, when implementing the position recognition process, the semiconductor device 20 can be positioned by looking through the wiring substrate 11B from above.

For this purpose, a transparent PI tape is used for the wiring substrate 11B such that the semiconductor device 20 can seen through the wiring substrate 11B. Also, the CCD camera 65B can be of a simple and cheap structure capable of imaging only one direction, since there is not a need for vertical imaging as is required for the method of the first embodiment. Thus, according to the method of the present embodiment, when implementing the position recognition of the semiconductor device 20 and the wiring substrate 11B, the semiconductor device 20 can be seen through the wiring substrate 11B. Therefore, the position recognition is facilitated.

Figure 22:
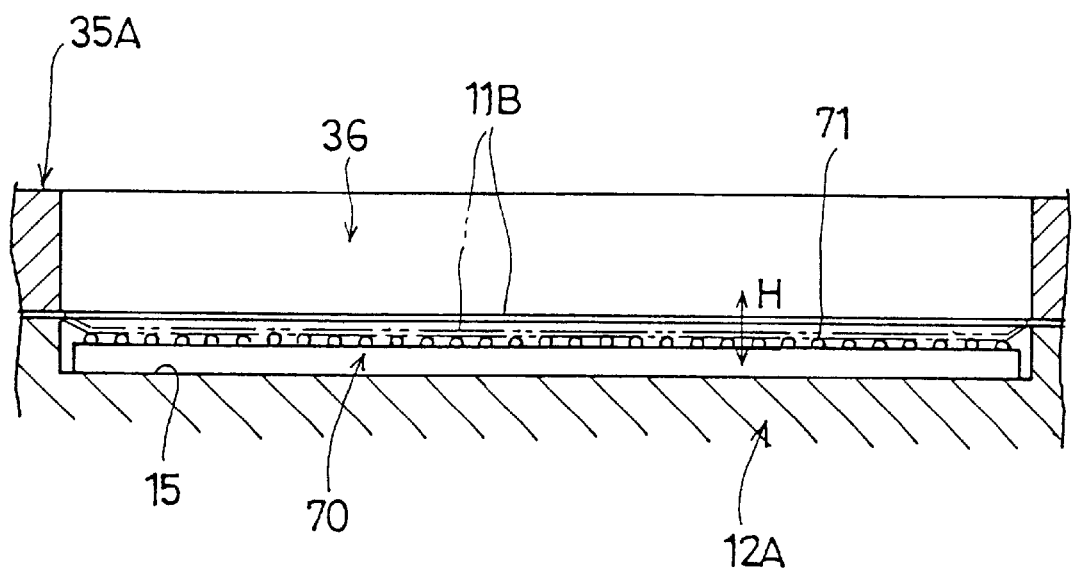
FIG. 22 is a cleaning method of semiconductor device contactor of one embodiment of the present invention.

In the following, a method of cleaning the contactor of one embodiment of the present invention will be described with reference to FIG. 22. The method of cleaning according to the present embodiment can be applied to any one of the contactors 10A to 10I of the above-described embodiments. The method of the present embodiment is for implementing a cleaning process of the contact electrodes 14 of the wiring substrates 11A to 11E provided on the respective contactors 10A to 10I. In the following, by way of example, a method of implementing a cleaning process of the contactor 10B of the second embodiment will be described.

In order to implement a cleaning process on the contact electrodes 14 of the wiring substrate 11B, first, instead of the semiconductor device 20, a cleaning member 70 is mounted on the mounting part 15 provided in the base unit 12A. The cleaning member 70 may be a wrapping sheet with fine protrusions and recesses 71.

When the cleaning member 70 is mounted on the mounting part 15 of the base unit 12A, subsequently, the position maintaining force applying mechanism 17 is driven. Thus, the wiring substrate 11B (cover unit 35A) is held on the base unit 12A.

Then, while maintaining the state where the wiring substrate 11B (cover unit 35A) is held on the base unit 12A, the contact pressure applying mechanism 16 is repeatedly driven and stopped. Thereby, the first closed area 31 is alternately and repeatedly brought to a state in which the contact pressure is applied and a state in which the contact pressure is not applied. In other words, the wiring substrate 11A will vibrate in the direction indicated with an arrow H in the figure.

Thereby, the cleaning member 70 will be repeatedly in contact with, slide on or collide with the contact electrodes 14 provided on the wiring substrate 111B. Thus, unnecessary layers such as an oxidization layer disposed on the contact electrodes 14 can be removed by means of the cleaning member 70. Accordingly, the contact electrodes 14 can be always kept in a good state, and it is possible to improve the reliability of the electric connection of the wiring substrate 11B against the semiconductor device 20.

Further, the present invention is not limited to these embodiments, but variations and modifications may be made without departing from the scope of the present invention.

The present application is based on Japanese priority application No. 10-361618 filed on Dec. 18, 1998, the entire contents of which are hereby incorporated by reference.

What is claimed is:

1. A contactor for semiconductor device, said contactor comprising a base unit for holding a semiconductor device provided with a plurality of terminals and a wiring substrate provided with contact electrodes at positions corresponding to at least some of said terminals, said contact electrodes and said terminals being electrically connected when said wiring substrate is held on said base unit, said contactor further comprising:
   a position maintaining force applying mechanism for applying a position maintaining force between said base unit and said wiring substrate;
   a contact pressure applying mechanism for applying a contact pressure between said semiconductor device and said wiring substrate;
   a connection region in which said contact electrodes are connected to said terminals; and
   a cover unit for covering said base unit, said cover unit holding said wiring substrate,
   wherein said position maintaining force applying mechanism and said contact pressure applying mechanism are operable in an independent manner.

2. The contactor as claimed in claim 1, wherein said wiring substrate is flexible at least at said connection region.

3. The contactor as claimed in claim 1, wherein said cover unit has an opening at said connection region.

4. The contactor as claimed in claim 1, wherein said wiring substrate may be connected to one of said semiconductor devices or to a plurality of said semiconductor devices simultaneously.

5. The contactor as claimed in claim 1, wherein said wiring substrate is a wafer.

6. The contactor as claims in claim 1, wherein said contact pressure applying mechanism comprises:
   a first seal member provided on said base unit at a position surrounding said semiconductor device mounted on said base unit, said first seal member being in hermetic contact with said wiring substrate when said wiring substrate is placed on said base unit;
   a first closed region enclosed by said base unit, said wiring substrate and said first seal member, said first closed region covering at least said connection region; and
   a first suction pipe having one end opened between said first seal member and a mounting position of said semiconductor device and connected to a first vacuum device at another end thereof and, by implementing a suction process, a negative pressure is applied to said first closed region via said first suction pipe,
   said negative pressure applied by said first suction pipe serving as the contact pressure between said semiconductor device and said wiring.substrate.

7. The contactor as claimed in claim 1, wherein said contact pressure applying mechanism is a lifting mechanism provided underneath the semiconductor device mounted on said base unit so as to move said semiconductor device downwards and upwards against said wiring substrate.

8. The contactor as claimed in claim 1, wherein said position maintaining force applying mechanism is provided at a position other than said connection region, said position maintaining force applying mechanism comprising:
   a second seal member provided on said base unit at a position surrounding said first seal member, said second seal member being in hermetic contact with said wiring substrate when said wiring substrate is placed on said base unit;
   a second closed region enclosed by said base unit, said wiring substrate, said first seal member and said second seal member; and
   a second suction pipe having one end opening between said first seal member and said second seal member and connected to a second vacuum device at another end thereof and, by implementing a suction process, a negative pressure is applied to said second closed region via said second suction pipe,
   said negative pressure applied by said second suction pipe serving as the position maintaining force between said wiring substrate and said base unit.

9. The contactor as claimed in claim 1, wherein said position maintaining force applying mechanism is a fastening mechanism applying a fastening force serving as the position maintaining force between said wiring substrate and said base unit.

10. The contactor as claimed in claim 1, wherein said wiring substrate is provided with a deformable part formed along a periphery of the connection region.

11. The contactor as claimed in claim 1, wherein said wiring substrate comprises a plurality of laminated wiring layers, and said contact electrodes provided on said wiring layers are selectively connected to said terminals.

12. The contactor as claimed in claim 1, further comprising a tension apply mechanism for applying a tension on the wiring substrate.

13. The contactor as claimed in claim 1, wherein said base unit is provided with a heat dissipation fin part.

14. The contactor as claimed in claim 1, wherein said base unit is provided with a temperature controlling device.

15. The contactor as claimed in claim 1, wherein said base unit is provided with a holding mechanism for forcedly holding the semiconductor device on said base unit.

16. The contactor as claimed in claim 1, wherein said wiring substrate and/or said base unit is provided with a friction increasing part for increasing the friction produced between said wiring substrate and said base unit.

17. The contactor as claimed in claim 1, further comprising:
 a third seal member provided between said wiring substrate and said cover unit; and
 a fourth seal member provided on said base unit and being in hermetic contact with said wiring substrate when said wiring substrate is placed on said base unit, wherein said wiring substrate is sandwiched between said third and fourth seal members when said wiring substrate is placed on said base unit.

18. The contactor as claimed in claim 1, wherein said wiring substrate has a connecting surface to which said semiconductor device is connected and an opposite surface on the opposite side of said connecting surface, said connecting surface and said opposite surface being electrically connected by conducting parts.

19. The contactor as claimed in claim 18, wherein said opposite surface is provided with at least one electronic component mounted thereon.

20. The contactor as claimed in claim 18, wherein said wiring substrate is, on said opposite surface, provided with a back-up sheet having protrusions and recesses.

* * * * *